US008053372B1

(12) United States Patent  
Greer et al.

(10) Patent No.: US 8,053,372 B1
(45) Date of Patent: Nov. 8, 2011

(54) METHOD OF REDUCING PLASMA STABILIZATION TIME IN A CYCLIC DEPOSITION PROCESS

(75) Inventors: Frank Greer, San Francisco, CA (US); Karl Leeser, San Jose, CA (US)

(73) Assignee: Novellus Systems, Inc., San Jose, CA (US)

(*) Notice: Subject to any disclaimer, the term of this patent is extended or adjusted under 35 U.S.C. 154(b) by 747 days.

(21) Appl. No.: 11/520,497

(22) Filed: Sep. 12, 2006

(51) Int. Cl.
 *H01L 21/36* (2006.01)
 *B01J 19/08* (2006.01)
 *C23C 16/453* (2006.01)

(52) U.S. Cl. .......... 438/762; 438/765; 427/255.23; 427/535; 427/570

(58) Field of Classification Search .......... None
 See application file for complete search history.

(56) References Cited

U.S. PATENT DOCUMENTS

| | | | |
|---|---|---|---|
| 4,058,430 A | 11/1977 | Suntola et al. |
| 4,389,973 A | 6/1983 | Suntola et al. |
| 4,895,107 A | 1/1990 | Yano et al. |
| 4,900,582 A | 2/1990 | Nakayama et al. |
| 4,975,252 A | 12/1990 | Nishizawa et al. |
| 4,985,657 A | 1/1991 | Campbell |
| 5,420,076 A | 5/1995 | Lee et al. |
| 5,438,587 A | 8/1995 | Kinley |
| 5,545,443 A | 8/1996 | Yamada et al. |
| 5,711,811 A | 1/1998 | Suntola et al. |
| 5,820,664 A | 10/1998 | Gardiner et al. |
| 5,916,365 A | 6/1999 | Sherman |
| 5,939,150 A | 8/1999 | Stelzle et al. |
| 6,015,590 A | 1/2000 | Suntola et al. |
| 6,060,130 A | 5/2000 | Kim |
| 6,200,893 B1 | 3/2001 | Sneh |
| 6,238,739 B1 | 5/2001 | Madar |
| 6,265,311 B1 | 7/2001 | Hautala et al. |
| 6,267,074 B1 | 7/2001 | Okumura |
| 6,335,063 B1 | 1/2002 | Chen et al. |
| 6,368,678 B1 | 4/2002 | Bluck et al. |
| 6,368,954 B1 | 4/2002 | Lopatin et al. |
| 6,416,822 B1 | 7/2002 | Chiang et al. |
| 6,428,859 B1 | 8/2002 | Chiang et al. |
| 6,459,501 B1 | 10/2002 | Holmes |

(Continued)

FOREIGN PATENT DOCUMENTS

| | | |
|---|---|---|
| EP | 0015 390 B1 | 9/1985 |
| WO | WO 96/17969 | 6/1996 |
| WO | WO 99/01595 | 1/1999 |

OTHER PUBLICATIONS

U.S. Appl. No. 60/251,795, "Method and apparatus for improved temperature control in atomic layer", Chiang et al., filed Dec. 6, 2000.

(Continued)

*Primary Examiner* — Kiesha Bryant
*Assistant Examiner* — Pamela E Perkins
(74) *Attorney, Agent, or Firm* — Weaver Austin Villeneuve & Sampson LLP

(57) ABSTRACT

The present invention relates to an enhanced cyclic deposition process suitable for deposition of barrier layers, adhesion layers, seed layers, low dielectric constant (low-k) films, high dielectric constant (high-k) films, and other conductive, semi-conductive, and non-conductive films. The deposition enhancement is derived from ions generated in a plasma. The techniques described reduce the time required for plasma stabilization, thereby reducing deposition time and improving efficiency.

20 Claims, 14 Drawing Sheets

U.S. PATENT DOCUMENTS

| | | | |
|---|---|---|---|
| 6,464,779 B1 | 10/2002 | Powell et al. | |
| 6,472,023 B1 | 10/2002 | Wu et al. | |
| 6,475,276 B1 | 11/2002 | Elers et al. | |
| 6,482,262 B1 | 11/2002 | Elers et al. | |
| 6,511,539 B1 | 1/2003 | Raaijmakers | |
| 6,518,195 B1 | 2/2003 | Collins et al. | |
| 6,569,501 B2 | 5/2003 | Chiang et al. | |
| 6,576,053 B1 | 6/2003 | Kim | |
| 6,576,534 B1 | 6/2003 | Zhang et al. | |
| 6,589,886 B2 | 7/2003 | Kim et al. | |
| 6,627,268 B1 | 9/2003 | Fair et al. | |
| 6,635,571 B2 | 10/2003 | Joo et al. | |
| 6,649,465 B2 | 11/2003 | Iijima et al. | |
| 6,720,260 B1 | 4/2004 | Fair et al. | |
| 6,759,081 B2 | 7/2004 | Huganen et al. | |
| 6,800,542 B2 | 10/2004 | Kim | |
| 6,849,122 B1 | 2/2005 | Fair | |
| 6,878,402 B2 | 4/2005 | Chiang et al. | |
| 6,949,450 B2 | 9/2005 | Chiang et al. | |
| 7,166,233 B2 * | 1/2007 | Johnson et al. | 216/67 |
| 7,264,846 B2 | 9/2007 | Chang et al. | |
| 7,399,357 B2 | 7/2008 | Sherman | |
| 7,422,986 B2 | 9/2008 | Carpenter et al. | |
| 7,871,678 B1 | 1/2011 | Greer et al. | |
| 7,897,215 B1 | 3/2011 | Fair et al. | |
| 2001/0048981 A1 | 12/2001 | Suzuki | |
| 2002/0076507 A1 | 6/2002 | Chiang | |
| 2002/0104481 A1 | 8/2002 | Chiang et al. | |
| 2002/0197402 A1 | 12/2002 | Chiang et al. | |
| 2003/0161969 A1 | 8/2003 | Hilliard | |
| 2006/0196418 A1 | 9/2006 | Lindfors et al. | |
| 2010/0055342 A1 | 3/2010 | Chiang et al. | |

OTHER PUBLICATIONS

U.S. Appl. No. 11/520,455, Office Action mailed Oct. 14, 2008.
U.S. Appl. No. 11/520,455, "Method of Increasing the Reactivity of a Precursor in a Cyclic Deposition Process," Greer et al., filed Sep. 12, 2006.
U.S. Appl. No. 11/498,949, Office Action mailed Feb. 17, 2009.
U.S. Appl. No. 11/498,949, Office Action mailed Jul. 1, 2008.
U.S. Appl. No. 11/498,949, "Method of Depositing an elemental film", filed Aug. 2, 2006.
U.S. Appl. No. 11/540,937, Office Action mailed Dec. 29, 2008.
U.S. Appl. No. 11/540,937, "Method for Improving The Nucleation and Morphology of Ruthenium Liners Deposited on Tantalum Nitride," Gopinath et al., filed Sep. 29, 2006.
U.S. Appl. No. 10/465,721, Examiner's Answer mailed Apr. 2, 2009.
U.S. Appl. No. 10/465,721, Office Action mailed Apr. 22, 2008.
U.S. Appl. No. 10/465,721, Office Action mailed Oct. 11, 2007.
U.S. Appl. No. 10/465,721, Office Action mailed Aug. 14, 2007.
U.S. Appl. No. 10/465,721, Office Action mailed May 31, 2007.
U.S. Appl. No. 10/465,721, Office Action mailed Dec. 7, 2006.
U.S. Appl. No. 10/465,721, Office Action mailed Aug. 17, 2006.
U.S. Appl. No. 10/465,721, Office Action mailed Jun. 15, 2006.
U.S. Appl. No. 10/465,721, Office Action mailed Jan. 10, 2006.
U.S. Appl. No. 10/465,721, Office Action mailed May 5, 2005.
U.S. Appl. No. 10/465,721, Office Action mailed Nov. 22, 2004.
U.S. Appl. No. 10/465,721, Office Action mailed Jul. 9, 2004.
U.S. Appl. No. 10/465,721, Office Action mailed May 4, 2004.
U.S. Appl. No. 10/465,721, Office Action mailed Dec. 11, 2003.
U.S. Appl. No. 10/465,721, "Sequential UV induced chemical vapor deposition", Fair et al., filed Jun. 18, 2003.
U.S. Appl. No. 11/520,455, Office Action mailed May 14, 2009.
U.S. Appl. No. 11/540,937, Office Action mailed Jul. 22, 2009.
U.S. Appl. No. 11/520,455, Office Action mailed Oct. 16, 2009.
U.S. Appl. No. 11/520,455, Office Action mailed Mar. 2, 2010.
U.S. Appl. No. 11/520,455, Notice of Allowance mailed Sep. 14, 2010.
U.S. Appl. No. 10/465,721, Notice of Allowance mailed Oct. 25, 2010.
Allowed Claims for U.S. Appl. No. 10/465,721 as of Oct. 25, 2010.
U.S. Appl. No. 10/600,622, Notice of Allowance mailed Oct. 28, 2003.

* cited by examiner

METHOD OF REDUCING PLASMA STABILIZATION TIME IN A CYCLIC DEPOSITION PROCESS

TECHNICAL FIELD

The present invention relates generally to the field of thin film deposition methods commonly used in the semiconductor, data storage, flat panel display, as well as allied or other industries. More particularly, the present invention relates to cyclic deposition techniques and apparatus suitable for deposition of barrier layers, adhesion layers, seed layers, low dielectric constant (low-k) films, high-dielectric constant (high-k) films, and other conductive, semi-conductive, and non-conductive thin films.

BACKGROUND

As integrated circuit (IC) dimensions shrink and the aspect ratios of the resulting features increase, the ability to deposit conformal, ultra-thin films on the sides and bottoms of high aspect ratio trenches and vias becomes increasingly important. These conformal, ultra-thin films may be barriers, liners, or seeds.

In addition, decreasing device dimensions and increasing device densities has necessitated the transition from traditional chemical vapor deposition (CVD) tungsten plug and aluminum interconnect technology to copper interconnect technology. This transition is driven by both the increasing impact of the RC interconnect delay on device speed and by the electromigration limitations of aluminum based conductors for sub 0.2 micron (μm) device generations. Copper is preferred due to its lower resistivity and higher (greater than 10 times) electromigration resistance as compared to aluminum. A single or dual damascene copper metallization scheme is used since it eliminates the need for copper etching and reduces the number of integration steps required. However, the burden now shifts to the metal deposition step(s) as the copper must fill predefined high aspect ratio trenches and/or vias in the dielectric.

Two major challenges exist for copper wiring technology: the barrier and seed layers. Copper can diffuse readily into silicon and most dielectrics. This diffusion may lead to electrical leakage between metal wires and poor device performance. An encapsulating barrier layer is needed to isolate the copper from the surrounding material (e.g., dielectric or silicon (Si)), thus preventing copper diffusion into or reaction with the underlying material. In addition, the barrier layer also serves as the adhesion or glue layer between the patterned dielectric trench or via and the copper used to fill it. The dielectric material can be a low dielectric constant, i.e., low-k material which typically suffers from poorer adhesion characteristics and lower thermal stability than traditional oxide insulators. Consequently, this places more stringent requirements on the barrier material and deposition method. An inferior adhesion layer will, for example, lead to delamination at either the barrier-to-dielectric or barrier-to-copper interfaces during any subsequent anneal or chemical mechanical planarization (CMP) processing steps leading to degradation in device performance and reliability. Ideally, the barrier layer should be thin, conformal, defect free, and of low resistivity.

In addition, electroplating fill requires a copper seed layer, which serves to both carry the plating current and act as the nucleation layer. The seed layer should be smooth, continuous, of high purity, and have good step coverage with low overhang. A discontinuity in the seed layer will lead to sidewall voiding, while gross overhang will lead to pinch-off and the formation of top voids.

Both the barrier and seed layers which are critical to successful implementation of copper interconnects require the deposition of high purity, conformal, ultra-thin films at low substrate temperatures.

Physical vapor deposition (PVD) or sputtering has been adopted as a method of choice for depositing conductor films used in IC manufacturing. This choice has been primarily driven by the low cost, simple sputtering approach whereby relatively pure elemental or compound materials can be deposited at relatively low substrate temperatures. For example, refractory based metals and metal compounds such as tantalum (Ta), tantalum nitride ($TaN_x$), other tantalum containing compounds, tungsten (W), tungsten nitride ($WN_x$), and other tungsten containing compounds which are used as barrier/adhesion layers can be sputter deposited with the substrate at or near room temperature. However, as device geometries have decreased, the step coverage limitations of PVD have increasingly become an issue since it is inherently a line-of-sight process. This limits the total number of atoms or molecules which can be delivered into the patterned trench or via. As a result, PVD is unable to deposit thin continuous films of adequate thickness, control, and coverage to coat the sides and bottoms of high aspect ratio trenches and vias with the necessary degree of conformality. Moreover, medium/high-density plasma and ionized PVD sources developed to address the more aggressive device structures are still not adequate and are now of such complexity that cost and reliability have become serious concerns.

CVD processes offer improved step coverage since CVD processes can be tailored to provide conformal films. Conformality ensures the deposited films match the shape of the underlying substrate, and the film thickness inside the feature is uniform and equivalent to the thickness outside the feature. CVD requires comparatively high deposition temperatures, suffers from high impurity concentrations, which impact film integrity, and have higher cost-of-ownership due to long nucleation times and poor precursor gas utilization efficiency. Following the tantalum containing barrier example, CVD Ta and TaN films require substrate temperatures ranging from 500° C. to over 800° C. and suffer from impurity concentrations (typically of carbon and oxygen) ranging from several to tens of atomic % concentration. This generally leads to high film resistivities (up to several orders of magnitude higher than PVD) and other degradation in film performance. These deposition temperatures and impurity concentrations make CVD Ta and TaN unusable for IC manufacturing, in particular for copper metallization and low-k integration.

A plasma-assisted (PACVD) or plasma-enhanced (PECVD) CVD approach has been demonstrated using tantalum pentabromide ($TaBr_5$) as the precursor gas to reduce the deposition temperature. Ta and $TaN_x$ films were deposited from 350° C. to 450° C. and contained 2.5 to 3 atomic % concentration of bromine.

Atomic layer chemical vapor deposition (ALCVD) or atomic layer deposition (ALD) has been proposed as an alternative method to CVD for depositing conformal, ultra-thin films at comparatively lower temperatures. ALD is similar to CVD except that the substrate is sequentially exposed to one reactant at a time. Conceptually, it is a simple process: a first reactant is introduced onto a heated substrate whereby it forms a monolayer on the surface of the substrate. Excess reactant is pumped out. Next a second reactant is introduced and reacts with the first reactant to form a monolayer of the desired film via a self-limiting surface reaction. The process is self-limiting since the deposition reaction halts once the initially adsorbed (physi- or chemisorbed) monolayer of the first reactant has fully reacted with the second reactant. Finally, the excess second reactant is evacuated. The above sequence of events comprises one deposition cycle. The desired film thickness is obtained by repeating the deposition cycle the required number of times.

In practice, ALD is complicated by the painstaking selection of a process temperature setpoint wherein both: 1) at least one of the reactants sufficiently adsorbs to a monolayer and 2) the surface deposition reaction can occur with adequate growth rate and film purity. If the substrate temperature needed for the deposition reaction is too high, desorption or decomposition of the first adsorbed reactant occurs, thereby eliminating the layer-by-layer process. If the temperature is too low, the deposition reaction may be incomplete (i.e., very slow), not occur at all, or lead to poor film quality (e.g., high resistivity and/or high impurity content). Since the ALD process is entirely thermal, selection of available precursors (i.e., reactants) that fit the temperature window becomes difficult and sometimes unattainable.

Continuing with the TaN example, ALD of TaN films is confined to a narrow temperature window of 400° C. to 500° C., generally occurs with a maximum deposition rate of 0.2 Å/cycle, and can contain up to several atomic percent of impurities including chlorine and oxygen. Chlorine is a corrosive, can attack copper, and lead to reliability concerns.

In conventional ALD of metal films, gaseous hydrogen ($H_2$) or elemental zinc (Zn) is often used as the second reactant. These reactants are chosen since they act as a reducing agent to bring the metal atom contained in the first reactant to the desired oxidation state in order to deposit the end film. Gaseous, diatomic hydrogen ($H_2$) is an inefficient reducing agent due to its chemical stability, and elemental zinc has low volatility and is generally incompatible with IC manufacturing. Due to the temperature conflicts that plague the ALD method and lack of kinetically favorable second reactant, serious compromises in process performance result.

In order to address the limitations of traditional thermal or pyrolytic ALD, radical enhanced atomic layer deposition (REALD) or plasma-enhanced atomic layer deposition has been proposed whereby a downstream radio-frequency (RF) glow discharge is used to dissociate the second reactant to form more reactive radical species which drives the reaction at lower substrate temperatures. Using such a technique, Ta ALD films have been deposited at 0.16 to 0.5 Å/cycle at 25° C., and up to approximately 1.67 Å/cycle at 250° C. to 450° C. Although REALD results in a lower operating substrate temperature than all the aforementioned techniques, the process suffers from several drawbacks. Higher temperatures must still be used to generate appreciable deposition rates. Such temperatures are still too high for some films of significant interest in IC manufacturing such as polymer-based low-k dielectrics that are stable up to temperatures of only 200° C. or less. REALD remains a thermal or pyrolytic process similar to ALD and even CVD since the substrate temperature provides the required activation energy for the process and is therefore the primary control means for driving the deposition reaction.

In addition, Ta films deposited using REALD contain chlorine as well as oxygen impurities, and are of low density. A low density or porous film leads to a poor barrier against copper diffusion since copper atoms and ions have more pathways to traverse the barrier material. Moreover, a porous or under-dense film has lower chemical stability and can react undesirably with overlying or underlying films, or with exposure to gases commonly used in IC manufacturing processes.

Another limitation of REALD is that the radical generation and delivery is inefficient and undesirable. RF plasma generation of radicals used as the second reactant such as atomic H is not as efficient as microwave plasma due to the enhanced efficiency of microwave energy transfer to electrons used to sustain and dissociate reactants introduced in the plasma. Furthermore, having a downstream configuration whereby the radical generating plasma is contained in a separate vessel, located remotely from the main chamber where the substrate is situated, negatively impacts the efficiency of transport of the second radical reactant.

SUMMARY

In one aspect, the invention features a method of depositing a film onto a substrate in a chamber. The method comprises (a) introducing at least one precursor vapor into the chamber to adsorb at least one layer of the precursor vapor on the substrate; (b) operating an excitation energy source to generate a plasma; (c) reacting the adsorbed layer of the precursor vapor with ions and radicals to form the film; and (d) outside of step (b), operating the excitation energy source at a power level less than at step (b) such that an afterglow or a plasma is maintained.

Various implementations of the invention may include one or more of the following features. The plasma is generated by an excitation energy source selected from the group consisting of microwave power, DC power, RF power, ultraviolet light, x-rays, a high DC field, a molecular beam, an ion beam, and combinations thereof.

In yet another aspect, the invention is directed to a sequential method for depositing a film onto a substrate in a deposition chamber. The method comprises (a) introducing a reactant gas into the chamber to adsorb at least one layer of the reactant gas onto the substrate; (b) removing any excess reactant gas from the chamber; (c) introducing at least one ion generating feed gas into the chamber; (d) introducing at least one radical generating feed gas into the chamber; (e) operating an excitation energy source at a first power level to generate a plasma from the ion generating feed gas and the radical generating feed gas to form ions and radicals; (f) prior or subsequent to step (e), operating the excitation energy source at a second power level greater than zero but less than the first power level; (g) exposing the substrate to the ions and the radicals; (h) modulating the ions; and (i) reacting the adsorbed layer of the reactant gas with the ions and the radicals to deposit the film.

Various implementations of the invention may include one or more of the following features. In the above-described method, step (b) is accomplished by evacuating or purging the chamber. The method is repeated until the film achieves a desired thickness. The method further includes exposing the substrate to at least one additional reactant gas. The substrate is simultaneously exposed to the ions and the radicals. The substrate is exposed to the ions after exposure to the radicals. At step (f), the excitation source is operated to form an afterglow or a plasma.

In still another aspect, the invention features a method for depositing a film onto a substrate in a chamber. The method comprises (a) introducing at least one reactant gas into the chamber to adsorb at least one layer of the reactant gas on the substrate; (b) generating a plasma from an ion generating feed gas to form ions and a radical generating feed gas to form radicals, by operation of an excitation energy source; (c) electrically biasing the substrate to a negative potential; (d) exposing the substrate to the ions and the radicals; (e) modulating the ions; (f) reacting the adsorbed layer of the reactant gas with the ions and the radicals to deposit the film; and (g) prior or subsequent to the generating step, operating the excitation energy source at a power level greater than zero but less than its level of operation at the generating step.

Other implementations of the invention may include one or more of the following features. The method is repeated until the film achieves a desired thickness. At step (g), the excitation energy source is operated to form an afterglow or a plasma. The reactant gas is exposed to an afterglow to form a more reactive reactant gas.

In another aspect, the invention is directed to a method of depositing a film onto a substrate wherein at least one precursor vapor is introduced into a deposition chamber to adsorb at least one layer of the precursor vapor on the substrate. An excitation energy source is operated at a first power level to generate an ion-generating plasma. The adsorbed layer of the precursor gas is reacted with ions and radicals to form a film. The first three steps of the above-described method and repeated. Between the first three steps of the above-described method and the fourth step of the above-described method, the excitation energy source is operated at a second power level greater than zero but less than the first power level.

The invention can include one or more of the following advantages. It can increase throughput by reducing the time required for plasma formation. The invention provides costs savings. Less power is required to run the deposition system and component life is improved.

The details of one or more embodiments are set forth in the accompanying drawings and the description below. Other features, objects and advantages will be apparent from the description and drawings, and from the claims.

DETAILED DESCRIPTION

The present invention relates to methods and apparatus useable for the deposition of thin films of one or more elements at low temperature. The present invention relates to cyclical deposition techniques and apparatus suitable for the deposition of barrier layers, adhesion layers, seed layers, low dielectric constant (low-k) films, high dielectric constant (high-k) films, and other conductive, semi-conductive, and nonconductive thin films.

Figure 1:
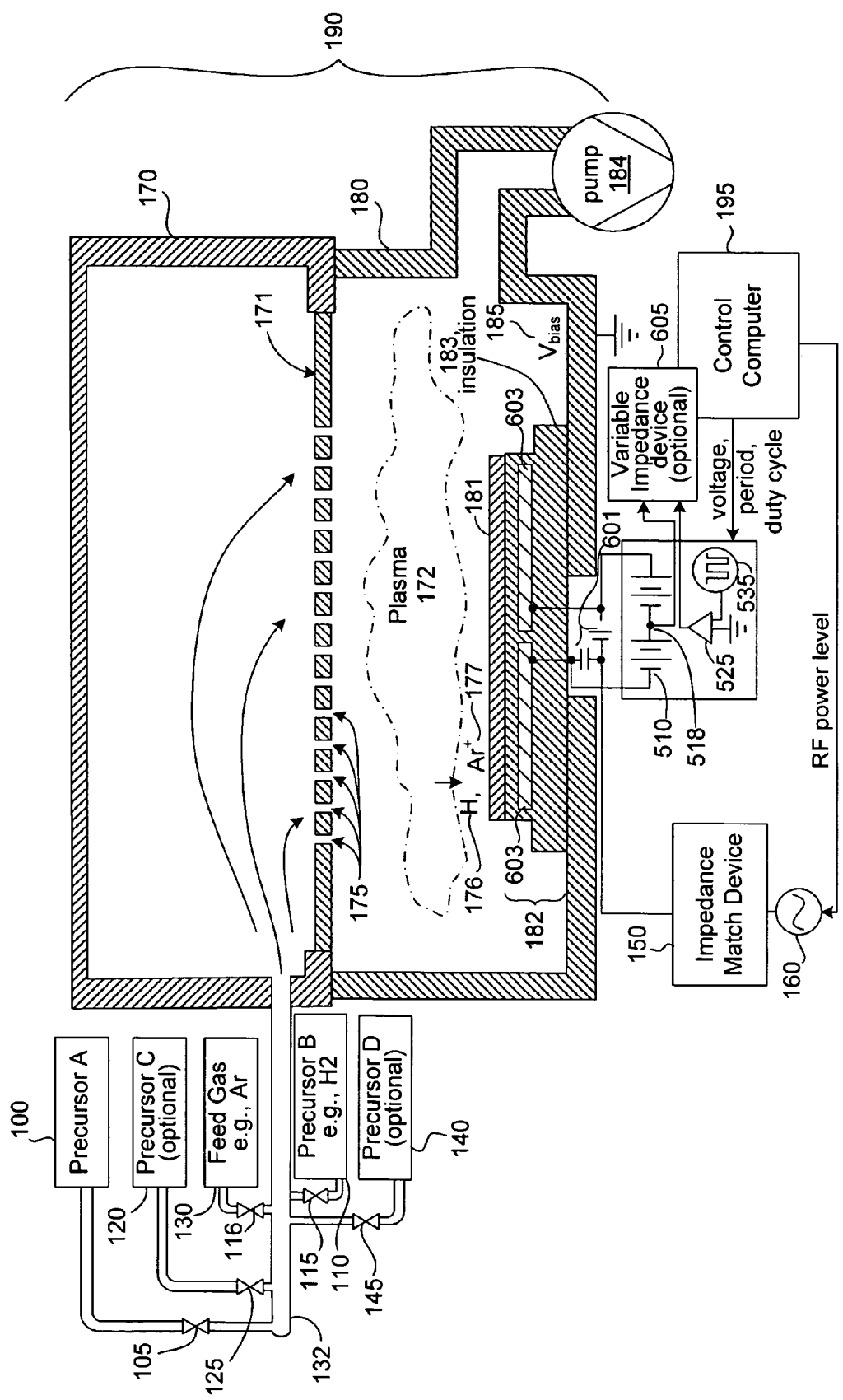
FIG. 1 is a schematic of a deposition system suitable for modulated ion-induced atomic layer deposition (MII-ALD).

FIG. 1 illustrates a deposition system suitable for modulated ion-induced atomic layer deposition (MII-ALD). The MII-ALD system described herein incorporates a means of modulating the exposure of the substrate to ions. By modulating (1) the ion flux; (2) the energy of the ions striking the substrate; or a combination of (1) and (2), the deposition reaction can be precisely toggled "on" or "off". If the ion flux or energy is at a "low" state, then no deposition results or deposition occurs so slowly that essentially no deposition results. If the impinging ion flux or energy is at a "high" state, then deposition occurs. Since a substrate (which may be a "bare" substrate, e.g., a silicon wafer before any films have been deposited, or it may be a substrate which may already have had one or more films deposited on its surface) is maintained at a low substrate temperature, the first and second reactants do not thermally react with any appreciable rate or do not react at all. Instead, the deposition reaction only takes place when either the ion flux or ion energy is toggled to a suitable "high state". The desired film thickness is built up by repeating the ion pulses (either of flux or energy) the required number of cycles. An MII-ALD system and method are described in U.S. Pat. No. 6,416,822, entitled "Continuous method for depositing a film by modulated ion-induced atomic layer deposition (MII-ALD)", and U.S. Pat. No. 6,428,859, entitled "Sequential Method for depositing a film by modulated ion-induced atomic layer deposition (MII-ALD)", both of which are assigned to the assignee of the subject application and which are both incorporated herein by reference.

In the deposition system of FIG. 1, all of the ion/radical generating feed gases and the precursor gases are introduced into a main body chamber 190 via a distribution showerhead 171 comprised of a series of arrays or apertures 175. However, other means for uniformly distributing gases essentially parallel or perpendicular to a face of a substrate 181 may also be used. It will be appreciated that although the showerhead 171 is shown to be above the substrate 181 to direct a gas flow downwards towards the substrate 181, alternative lateral gas introduction schemes are possible with this embodiment. Various lateral gas introduction schemes are described in U.S. Publication No.: US2002/0197402A1, Publication Date: Dec. 26, 2002, entitled "System for depositing a film by modulated ion-induced atomic layer deposition (MII-ALD)", application Ser. No. 10/215,711, filed Aug. 8, 2002, which is herein incorporated by reference.

In the embodiment of FIG. 1, a source of RF bias power 160 is coupled to one or more ESC electrodes 603 in a substrate pedestal 182, which includes insulation 183, via an impedance matching device 150. The ESC electrodes 603 may be of any arbitrary shape. The RF bias power provides power for both ion generation during modulated ion induced atomic layer deposition and energy control of the generated ions. The applied RF bias power is used to generate a plasma 172 in a main process chamber 180, for example, between the substrate 181 and the showerhead 171 to dissociate feed gases 110, 130 to generate ions 177 and radicals 176 and to induce a negative potential $V_{bias}$ 185 (i.e., a DC offset voltage typically −10V to −80V at ≦475 W RF power and 0.1-5 Torr pressure) on the substrate 181. The negative potential $V_{bias}$ 185 modulates the energy of the positively charged ions in the plasma and attracts the positively charged ions toward the surface of the substrate. The positively charged ions impinge on the substrate 181, driving the deposition reaction and improving the density of the deposited film. The ion energy is more specifically given by $E=e|V_p|+e|V_{bias}|$, where $V_p$ is the plasma potential (typically 10V to 20V) and $V_{bias}$ is the negative potential $V_{bias}$ 185 induced on the substrate 181. The negative potential $V_{bias}$ 185 is controlled by the applied RF bias power. For a given process region geometry, the induced negative potential $V_{bias}$ 185 increases with increasing RF bias power and decreases with decreasing RF bias power.

Controlling the RF bias power also controls the density and hence the number of ions generated in the plasma. Increasing the RF bias power generally increases the ion density, leading to an increase in the flux of ions impinging on the substrate. Higher RF bias powers are also required for larger substrate diameters. A preferred power density is ≦0.5 W/cm², which equates to approximately ≦150 W for a 200 mm diameter substrate. Power densities ≧3 W/cm² (greater than about 1000 W for a 200 mm diameter substrate) may lead to undesired sputtering of the deposited film.

The frequency of the RF bias power can be 400 kHz, 13.56 MHz, or higher (e.g. 60 MHz, etc.). A low frequency (e.g. 400 kHz), however, can lead to a broad ion energy distribution with high energy tails which may cause excessive sputtering. The higher frequencies (e.g., 13.56 MHz or greater) lead to tighter ion energy distributions with lower mean ion energies, which is favorable for modulated ion-induced ALD deposition processes. The more uniform ion energy distribution occurs because the RF bias polarity switches before ions can impinge on the substrate, such that the ions see a time-averaged potential.

As shown in FIG. 1, a source of applied DC bias can also be coupled to the ESC substrate pedestal 182. The source can be a DC power supply 510 coupled by a center tap 518 to a voltage source 525 with the ability to vary the voltage or exhibit an infinite impedance. Optionally, a variable impedance device 605 may be coupled in series between the voltage source 525 and the center tap 518 of the DC power supply 510. The voltage source 525 is itself coupled to a waveform generator 535. The waveform generator may be a variable-type waveform generator. An exemplary variable-type waveform generator may be controlled by a control computer 195 and have a variable waveform at different times within a given process and may additionally have a non-periodic output signal. The source of applied DC bias can be coupled to the ESC substrate pedestal 182 by RF blocking capacitors 601 that both provide a DC open for the DC power supply 510 and prevent RF energy from corrupting the DC power supply 510.

In MII-ALD, the same plasma is used to generate both ions 177 (used to drive the surface reactions) and radicals 176 (used as the second reactant). The MII-ALD system utilizes ion imparted kinetic energy transfer rather than thermal energy (e.g., REALD, ALD, PECVD, CVD, etc.) to drive the deposition reaction. Since temperature can be used as a secondary control variable, with this enhancement films can be deposited using MII-ALD at arbitrarily low substrate temperatures (generally less than 350° C.). In particular, films can be deposited at or near room temperature (i.e., 25° C.) or below.

The system of FIG. 1 contains a substantially enclosed chamber 170 located in substantial communication with or substantially within a main chamber body 190. The feed gases 110, 130 are delivered to the plasma source chamber 170 via valving 115 and 116, and a gas feed line 132. Typical feed gases 130 used for ion generation include, but are not restricted to, Ar, Kr, Ne, He, and Xe. Typical feed gases 110 (e.g., precursor B) used for radical generation include, but are not restricted to $H_2$, $O_2$, $N_2$, $NH_3$, and $H_2O$ vapor. The ions 177 are used to deliver the energy needed to drive surface reactions between the first adsorbed reactant and the generated radicals 176.

A first reactant 100 (e.g., precursor A) is introduced to the chamber 170 via valving 105 and the gas feed line 132. Precursor A may be any one or more of a series of gaseous compounds used for depositing semiconductors, insulators, metals or the like that are well-known in the art (e.g., PDEAT (pentakis(diethylamido)tantalum), PEMAT (pentakis(ethylmethylamido)tantalum), $TaBr_5$, $TaCl_5$, TBTDET (t-butylimino tris(diethylamino)tantalum), $TiCl_4$, TDMAT (tetrakis (dimethylamido)titanium), TDEAT (tetrakis(diethylamino) titanium), CuCl, Cupraselect® ((Trimethylvinylsilyl) hexafluoroacetylacetonato Copper I), $W(CO)_6$, $WF_6$, etc.).

Figure 2A:
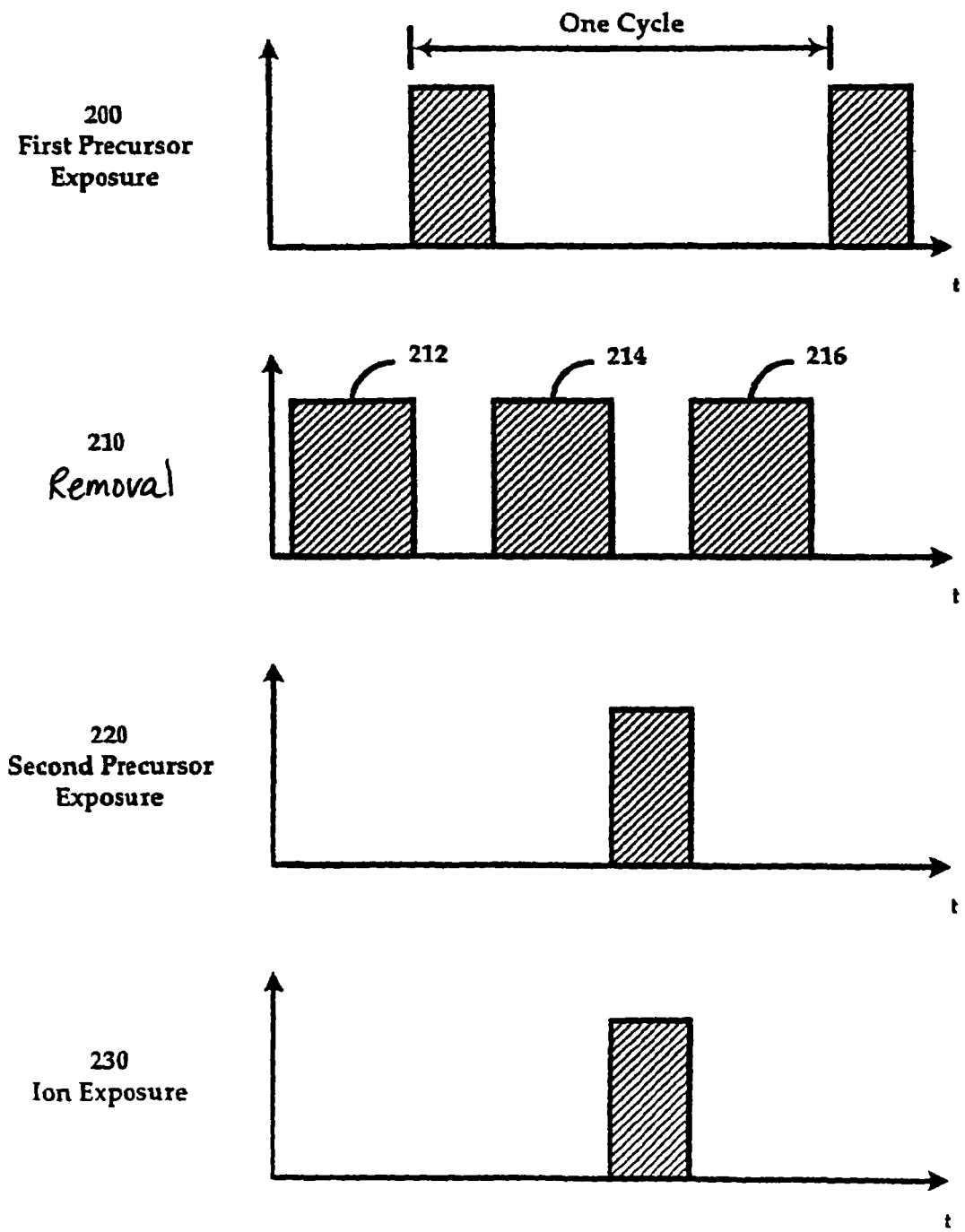
FIG. 2A depicts a timing sequence for an MII-ALD method incorporating periodic exposure of the substrate to ions.

FIG. 2A depicts a sequence for an MII-ALD method incorporating periodic exposure of the substrate to ions. In this method, ion exposure 230 begins with the introduction of the second precursor 220 (especially when plasma generated radicals 176 are used as the second precursor or reactant). This figure illustrates one embodiment of MII-ALD utilizing the apparatus described in FIG. 1. This results in a sequential ALD process as follows:

1) First exposure 200: The substrate 181 is exposed to a first gaseous reactant 100 (e.g., precursor A), allowing a monolayer of the reactant to form on the surface. The substrate 181 may be at a temperature above or below the decomposition temperature of the first gaseous reactant although it is preferable for the temperature to generally be less than approximately 350° C.

2) First removal 210: The excess reactant 100 is removed by evacuating 214 the chamber 180 with a vacuum pump 184. Note that prior to the first exposure 200, the chamber was initially evacuated 212. Alternatively, the chamber may be purged rather than evacuated.

3) Second exposure 220: Unlike conventional ALD, the substrate 181 is simultaneously exposed to ions 177 and a second gaseous reactant during this step with the substrate 181 (e.g., wafer) biased to a negative potential $V_{bias}$ 185. The ions will strike the wafer 181 with an energy (E) approximately equal to $(e|V_{bias}|+e|V_p|)$ where $V_p$ is the plasma 172 potential (typically 10V to 20V) and $V_{bias}$ is the negative potential bias 185 induced on the substrate. With the activation energy now primarily supplied by ions 177 instead of thermal energy, the first and second (chemi- or physi-sorbed) reactants react via an ion-induced surface reaction to produce a solid thin monolayer of the desired film at a reduced substrate temperature below conventional ALD. The deposition reaction between the first and second reactants is self-limiting in that the reaction between them terminates after the initial monolayer of the first reactant 100 is consumed.

4) Second removal 210: The excess second reactant is removed by again evacuating or purging 216 the chamber 180.

5) Repeat: The desired film thickness is built up by repeating the entire process cycle (steps 1-4) many times.

Additional precursor gases (e.g., 120, 140) may be introduced and evacuated as required for a given process to create tailored films of varying compositions or materials. As an example, an optional exposure may occur in the case of a compound barrier of varying composition. For example, a $TaN_x$/Ta film stack is of interest in copper technology since $TaN_x$ prevents fluorine attack from the underlying fluorinated low-k dielectrics, whereas the Ta promotes better adhesion and crystallographic orientation for the overlying copper seed layer. The $TaN_x$ film may be deposited using a tantalum containing precursor (e.g., $TaCl_5$, PEMAT, PDEAT, TBTDET) as the first reactant 100 (precursor A) and a mixture of atomic hydrogen and atomic nitrogen (i.e. flowing a mixture of $H_2$ and $N_2$ into the plasma source 172) as the second reactant to produce a $TaN_x$ film. Simultaneous ion exposure is used to drive the deposition reaction. Next a Ta film may be deposited in a similar fashion by using atomic hydrogen (as opposed to a mixture of atomic hydrogen and nitrogen) as the second reactant. An example of a tailored film stack of differing materials can be the subsequent deposition of a copper layer over the $TaN_x$/Ta bi-layer via the use of a copper containing organometallic (e.g., 25 Cu(TMVS)(hfac) or (Trimethylvinylsilyl) hexafluoroacetylacetonato Copper I, also known by the trade name CupraSelect®, available from Schumacher, a unit of Air Products and Chemicals, Inc., 1969 Palomar Oaks Way, Carlsbad, Calif. 92009) or inorganic precursor (e.g. CuCl) shown as precursor C 120 in FIG. 1. The copper layer can serve as the seed layer for subsequent electroless or electroplating deposition.

Figure 2B:
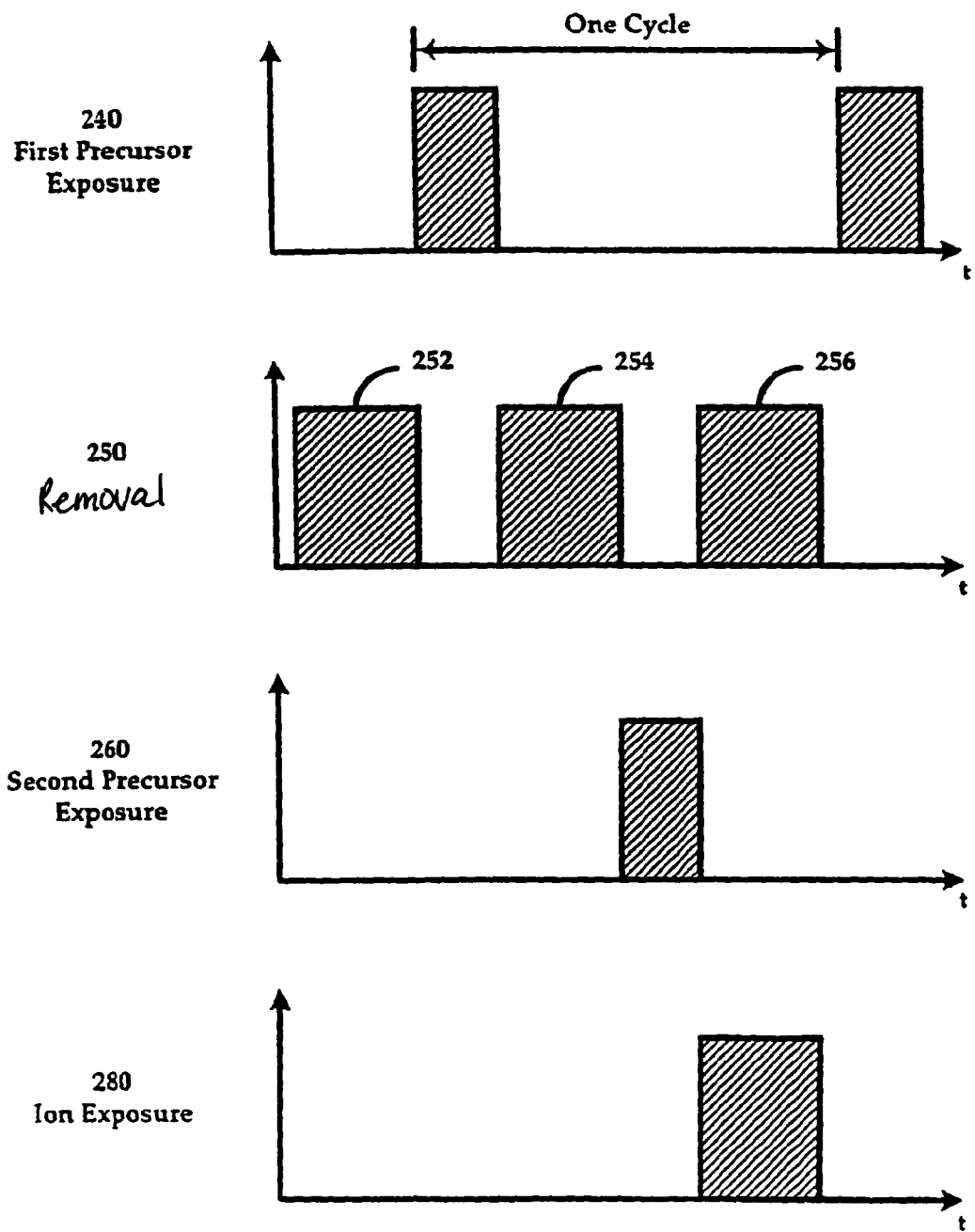
FIG. 2B is another timing sequence for an MII-ALD method incorporating periodic exposure of the substrate to ions.

A variant of the method shown in FIG. 2A is illustrated in FIG. 2B where ion exposure is initiated after the second reactant exposure. FIG. 2B depicts a sequence for a method incorporating periodic exposure of the substrate 181 to ions 177. In this variant of the method, ion exposure 280 begins with the removal 250 of the second precursor 260 (especially when the second precursor or reactant is not subjected to a plasma). Typically, this is the case where the second precursor or reactant is not a plasma-generated radical.

In another embodiment of the MII-ALD process, a substrate 181 heated (e.g., to a low temperature of less than or equal to 350° C.) or unheated is simultaneously exposed to a first reactant and a second reactant, and subjected to modulated ion 177 exposure. By modulating (1) the ion flux (i.e. the number of ions hitting the substrate per unit area per unit time); (2) the energy of the ions striking the substrate; or a combination of (1) and (2), the deposition reaction can be precisely toggled "on" or "off". Since the substrate 181 is maintained at a low substrate temperature, the first and second reactants do not thermally react with any appreciable rate or do not react at all when the ion flux or energy is toggled to a "low" state. Instead, the deposition reaction only takes place when either the ion flux or ion energy is toggled to a suitable "high state". Ion flux or energy modulation can vary generally from 0.1 Hz to 20 MHz, preferably from 0.01 KHz to 10 KHz. During deposition, the main process chamber 180 pressure can be maintained in the range of generally $10^2$ to $10^{-7}$ torr, more preferably from $10^1$ to $10^{-4}$ torr, depending on the chemistry involved. The desired film thickness is attained via exposure of the substrate to the suitable number of modulated ion flux or energy pulse cycles. This MII-ALD scheme results in a continuous deposition process. The modulation can be either of the ion flux via the plasma power or of the ion energy via an applied periodic wafer bias.

Figure 3A:
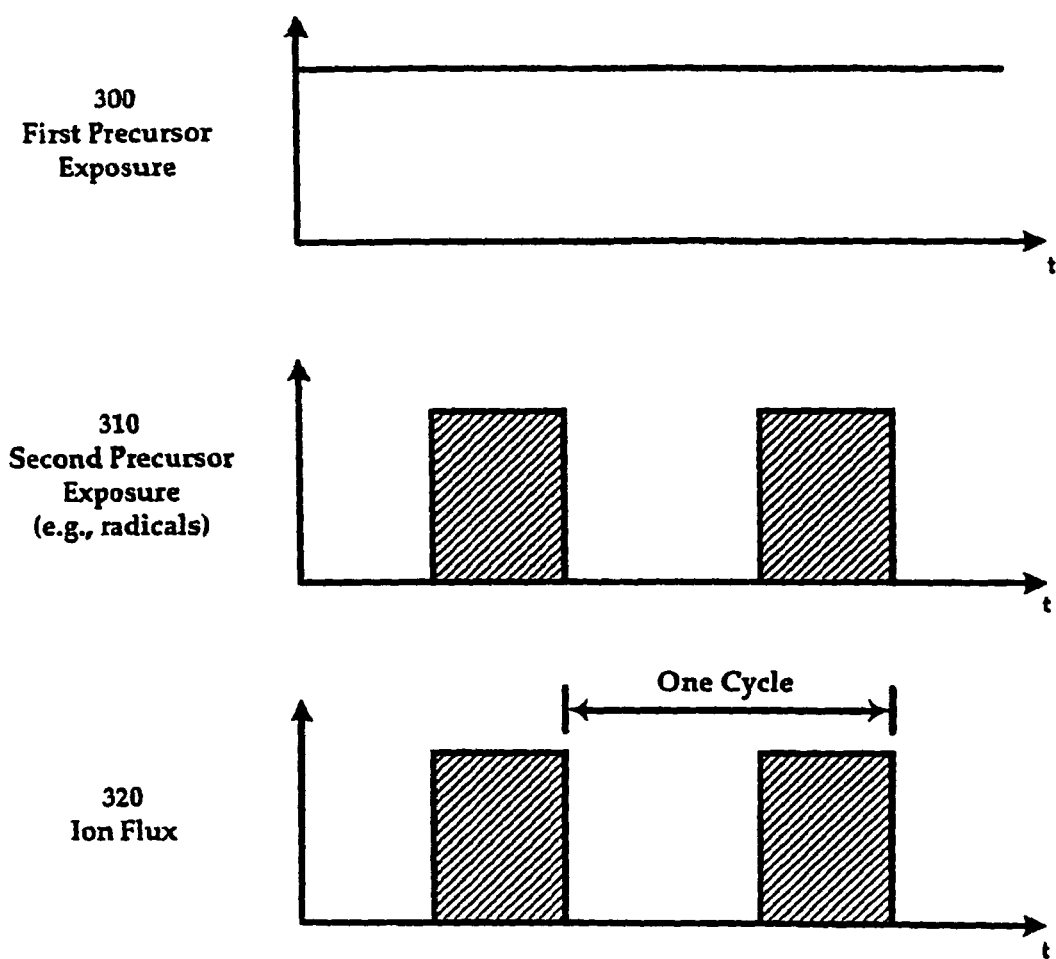
FIG. 3A shows the MII-ALD method utilizing ion flux modulation to vary the substrate exposure to ions.
Figure 4A:
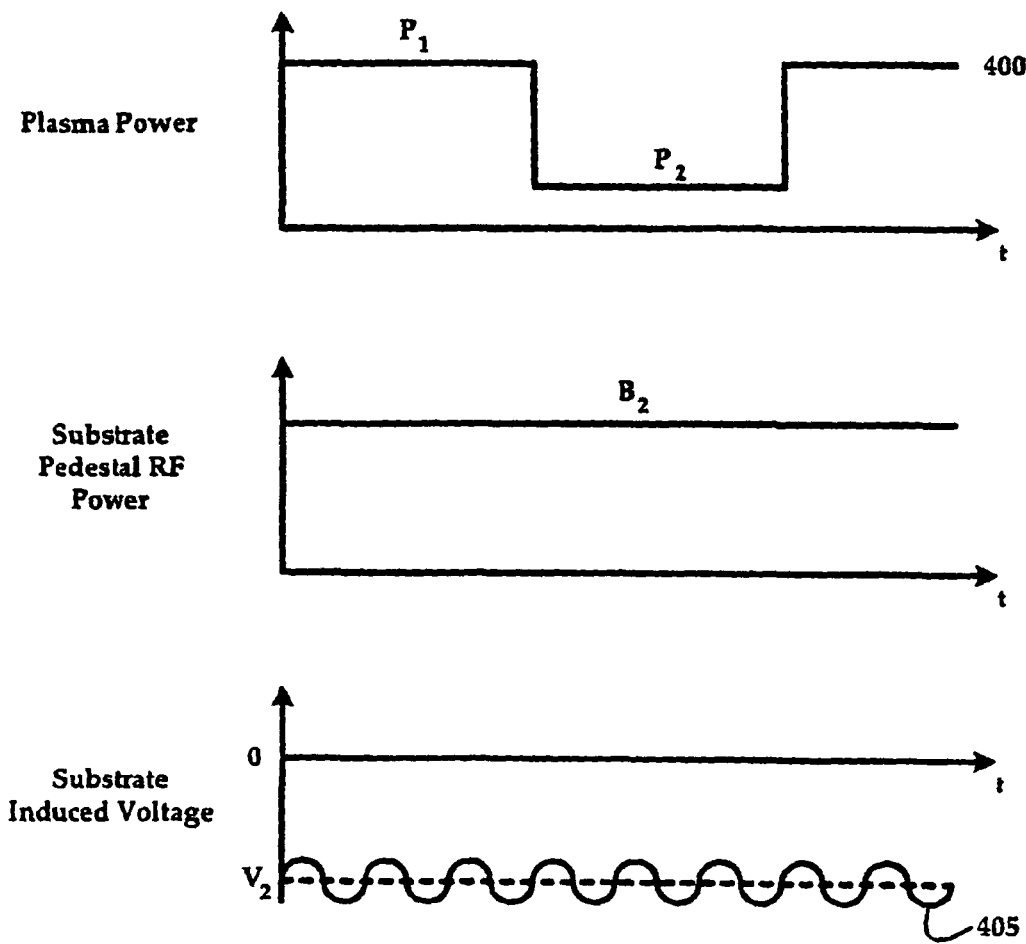
FIGS. 4A, 4B, 4C, 4D, 4E and 4F show methods of modulating the MII-ALD process.
Figure 4B:
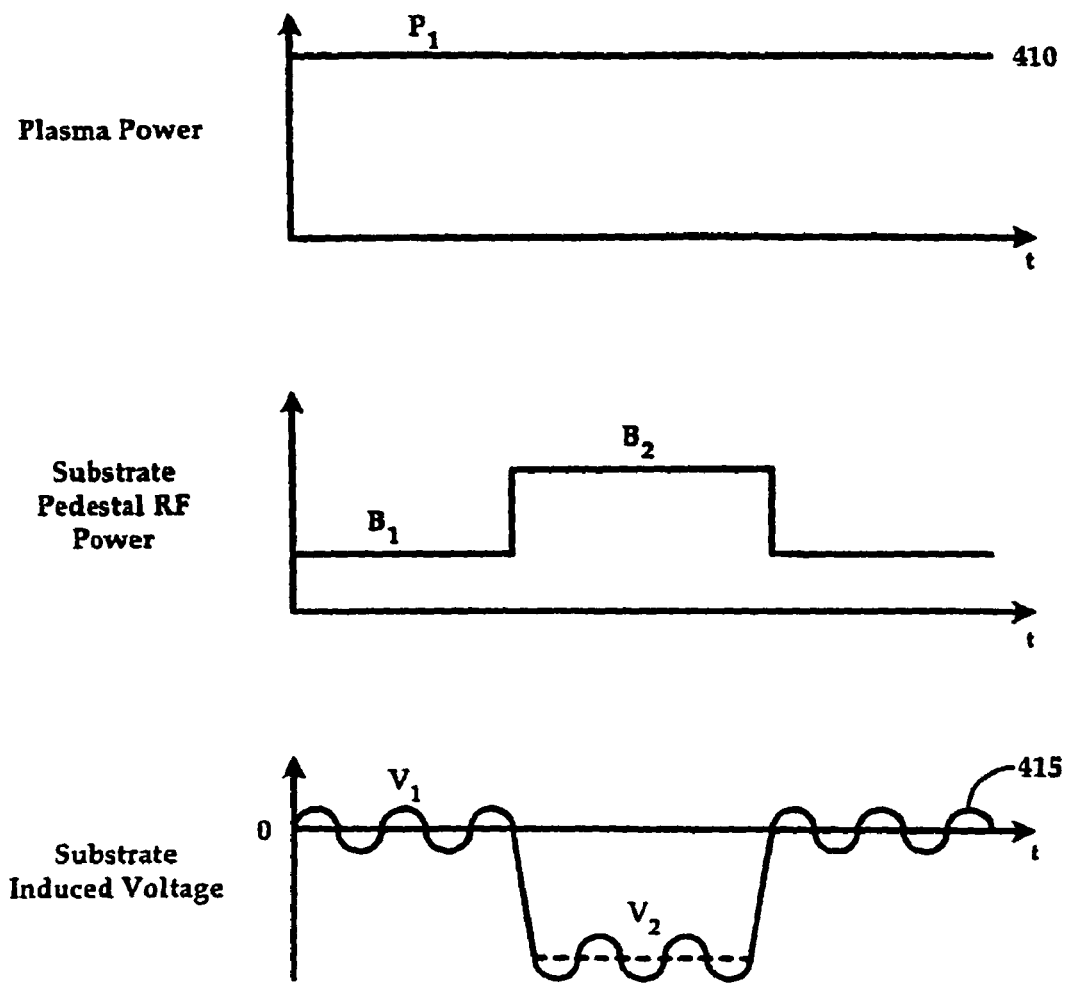
Figure 4C:
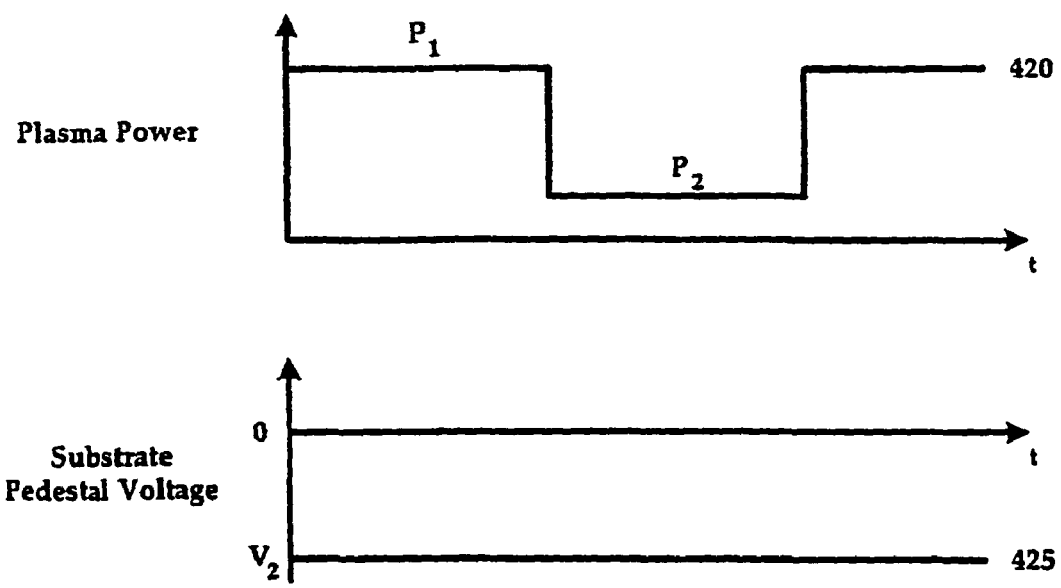

The MII-ALD method utilizing ion flux modulation to control the deposition cycle is illustrated conceptually in FIG. 3A, with the flux modulation scheme described more explicitly in FIGS. 4A and 4C. FIG. 3A depicts the MII-ALD method utilizing ion flux modulation 320 to vary the substrate 181 exposure to ions 177. Note that the second reactant 310, e.g., radicals, is synchronized with the ion flux via 320 plasma power modulation, causing a periodic exposure of the substrate to ions and radicals. Varying the power 160 delivered to the plasma 172 can vary the ion flux from little or none to maximum ion production. Plasma power modulation can take the form of variations in frequency (periodicity), magnitude, and duty-cycle. Increasing plasma power 160 leads to increasing plasma 172, and hence, increased ion 177 density.

Since the deposition process is ion-induced, having little or no ion bombardment will essentially stop the deposition process, whereas increased ion bombardment will cause deposition to occur. A constant wafer bias 185 (DC in FIG. 4C or RF in FIG. 4A) is applied to define the ion energy of the modulated ion flux in this embodiment and is chosen to be sufficiently high so that ion-induced surface reactions can occur. Note that in this embodiment since the plasma power 160 is used to generate both ions 177 and radicals 176, the second reactant (e.g., radicals) flux 310 is synchronized with the ion flux 320 pulses. The radical feed gas 110 ($H_2$ for example) flow, however, does not change. Instead, the radical flux 310 (e.g., fraction of $H_2$ which is converted to atomic H) is modulated.

Figure 3B:
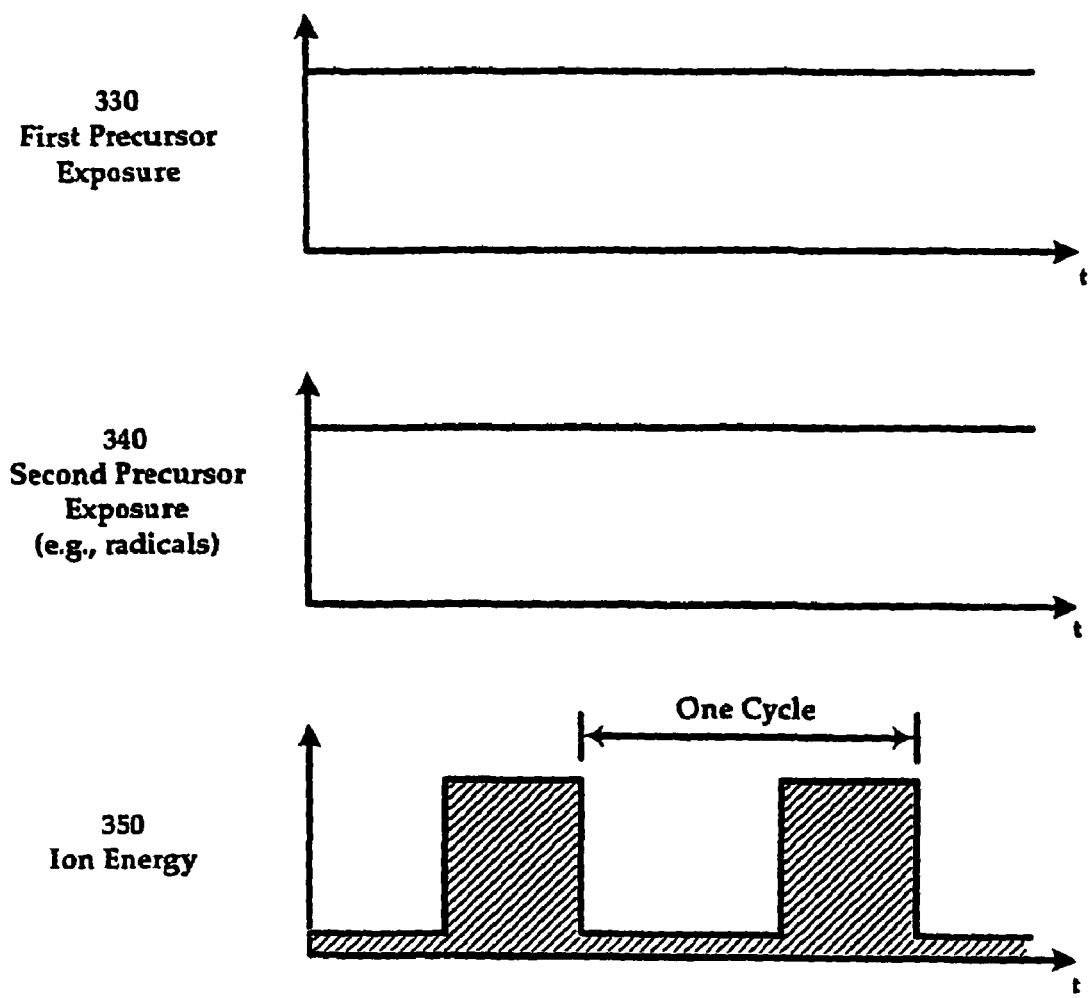
FIG. 3B shows the timing of the MII-ALD method utilizing ion energy modulation to vary the substrate exposure to ions by varying the substrate bias.
Figure 4D:
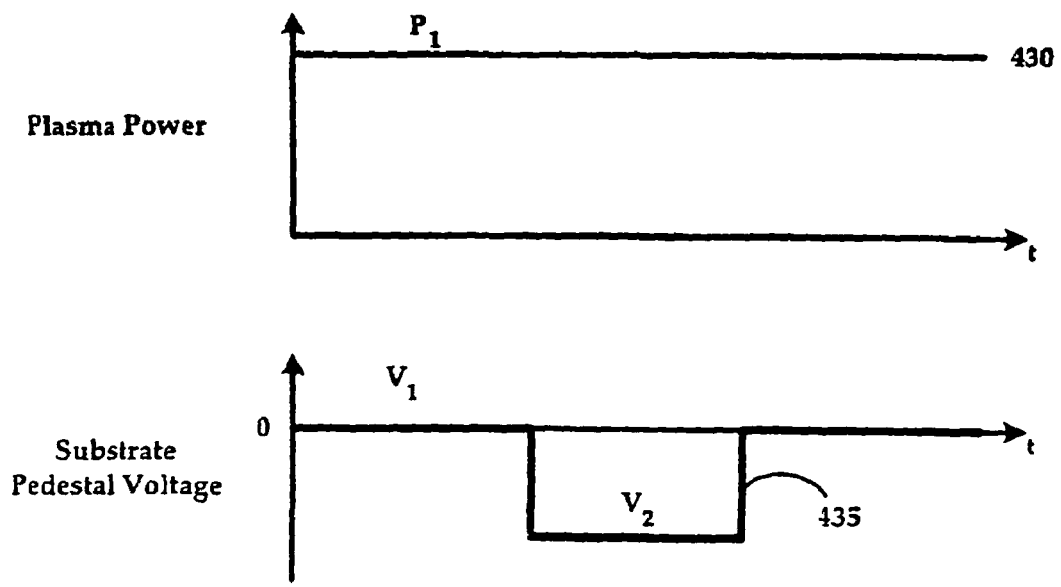

Alternatively, subjecting the substrate 181 to a non-constant wafer voltage bias 185 can vary the incoming ion energy at a fixed plasma power 160 (i.e., ion flux). This embodiment of MII-ALD is illustrated conceptually in FIGS. 3B, and more explicitly in FIGS. 4B and 4D. FIG. 3B shows the MII-ALD method utilizing ion energy modulation 350 to vary the substrate 181 exposure to ions 177 by varying the substrate bias 185. The applied bias 185 can take the form of variations in frequency (periodicity), magnitude, and duty-cycle. A DC, as shown in FIG. 4D, or RF (e.g., 400 kHz, 2 MHz, 13.56 MHz, etc.), as shown in FIG. 4B, power supply can be used. When the wafer potential is "low" (e.g., near or at zero with respect to ground), the incoming ions 177 do not have enough energy to induce surface deposition reactions. When the wafer 181 potential is "high" (e.g., at a significant negative potential relative to ground), the incoming ions 177 will have the necessary energy to induce surface deposition reactions via collision cascades. In such a fashion, the deposition can be turned "on" or "off" by modulating the wafer bias voltage 185, and hence the impinging ion 177 energy. Typical wafer voltages can range from generally −20 V to −1000 V, but preferably in the −25 V to −500 V range, and more preferably in the −50 V to −350 V range during deposition. The bias voltage 185 is coupled to the wafer via the pedestal 182. The substrate pedestal 182 may be an electrostatic chuck (ESC) to provide efficient coupling of bias voltage to the substrate. The ESC is situated in the main processing chamber 180 and can be cooled via a fluid coolant (preferably a liquid coolant) and/or heated (e.g., resistively) to manipulate the substrate temperature.

Figure 5:
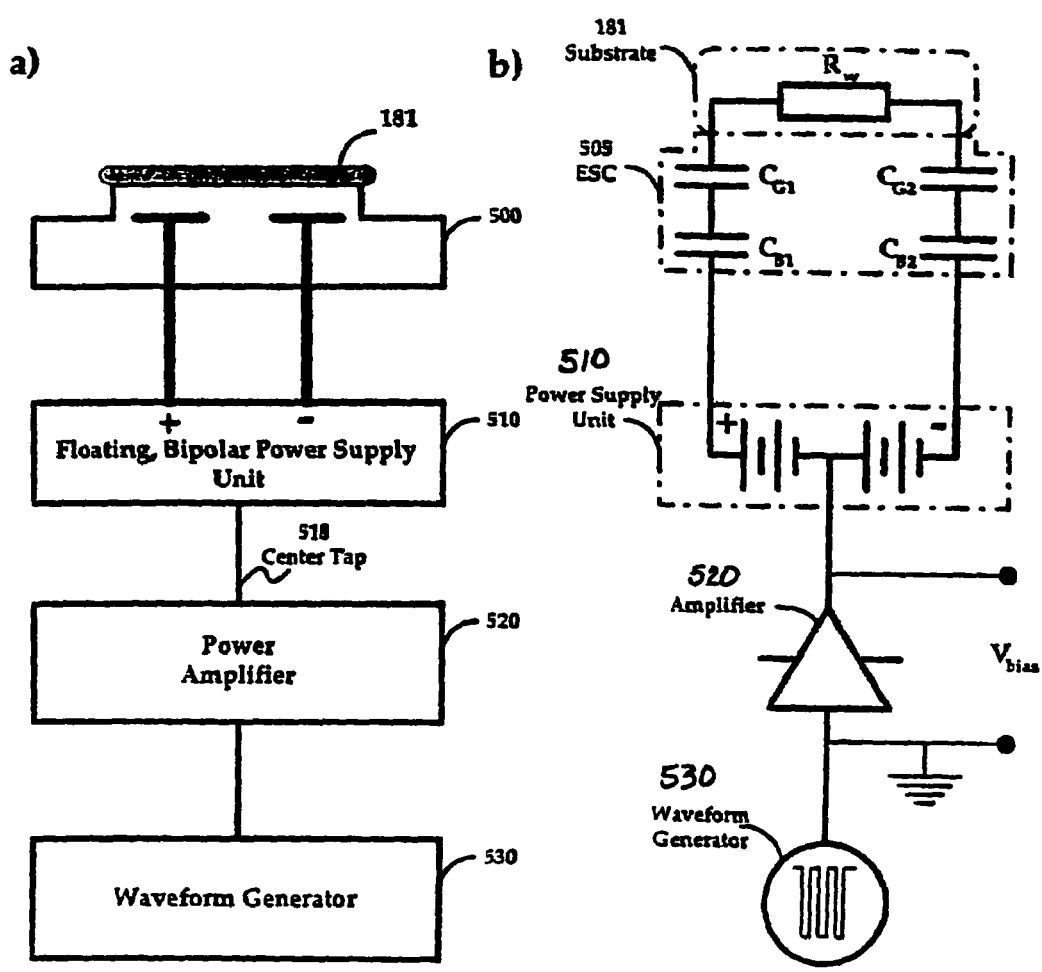
FIGS. 5a and 5b show an electrostatic chuck (ESC) system suitable for modulating the ion energy in the MII-ALD process: a) in topological form; and, b) as an equivalent electrical circuit.

As illustrated in FIGS. 5a and 5b for the case of an applied DC bias, the electrostatic chuck is a ESC 500 (bulk resistivity generally greater than $10^{13}$ ohm-cm) rather than one whose bulk material effects are dominated by the Johnson-Rahbek (JR) effect (bulk resistivity between $10^8$ and $10^{12}$ ohm-cm). Typically, the substrate potential is a complex function of the voltage of the electrostatic "chucking" electrodes if these voltages are established relative to a reference potential, but is simplified in the case of (non-JR) ESC. However, if a power supply 510 that powers the ESC 500 is truly floating, i.e., the entire system has a high impedance to the chamber 180 potential (usually ground) including the means of supplying power, then the substrate potential can be arbitrary. In particular, if the ESC power supply 510 is also center-tapped 518, then the wafer potential can be established by connecting the center tap 518 to the output of a power amplifier 520. A waveform generator 535 coupled to the power amplifier 520 can be controlled by a control computer 195 (FIGS. 1 and 6) to, for example, periodically drop the substrate potential to a negative value for a certain period of time or apply a given frequency to the ESC 500. It is desired to have independent control of the magnitude, frequency (periodicity), and duty cycle of this substrate bias pulse train. Such an ESC system is depicted in FIG. 5, which shows an ESC system suitable for modulating the ion energy in the MII-ALD process: a) in topological form; and, b) as an equivalent electrical circuit.

The deposition rate is affected by the choice of the critical bias pulse train variables: the magnitude, frequency (periodicity), and duty cycle. Preferably, when the bias frequency is high (e.g., 100 Hz-10 KHz) with a short duty cycle (e.g., less than 30%), reducing the net, time-averaged current (which can cause substrate potential drift, de-chucking problems, or charge-induced device damage) while providing a charge relaxation period wherein the ion charges accumulated during ion exposure can redistribute and neutralize.

Once the deposition rate is calibrated for a particular recipe (Angstroms/cycle), the ability to accurately determine the film thickness by counting cycles is a further benefit of this modulation scheme. The higher the frequency, the finer the resolution of this critical deposition process performance metric.

Figure 4E:
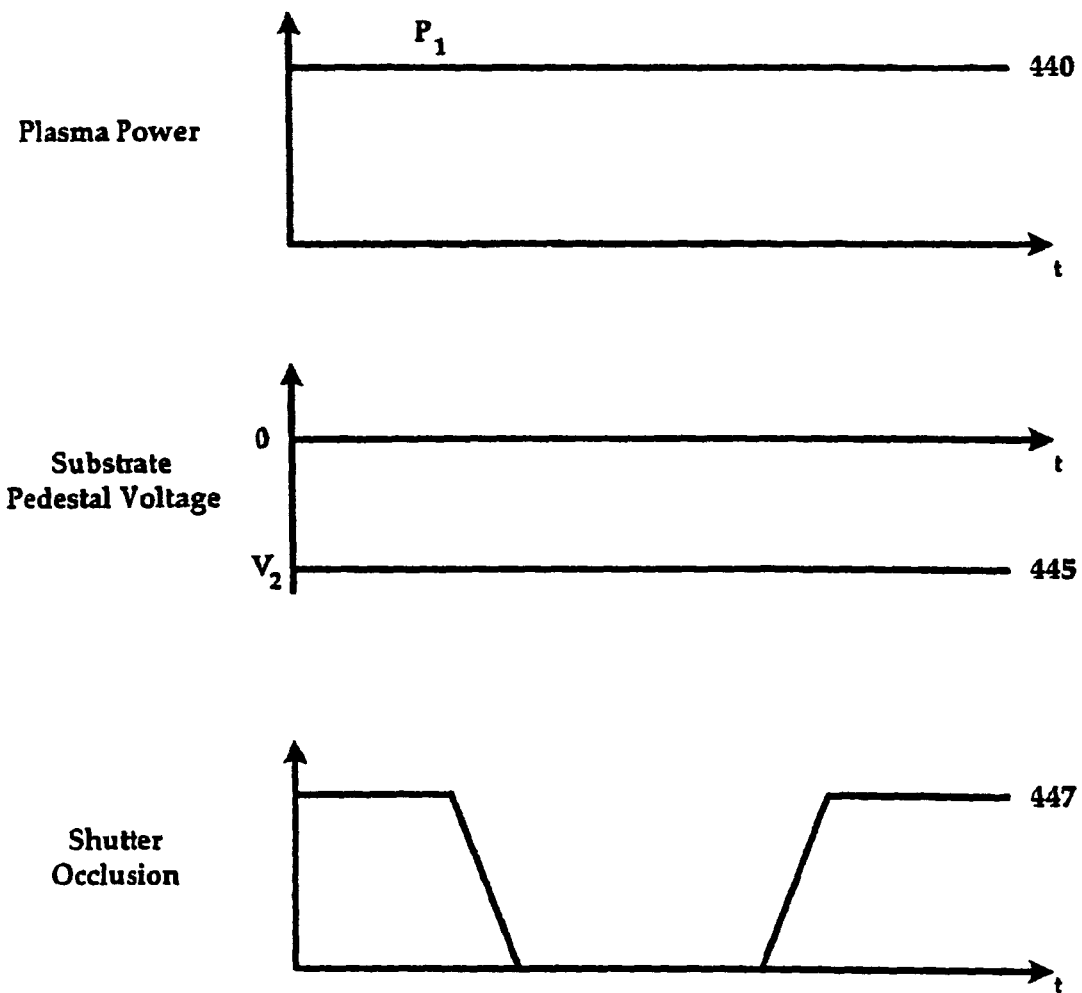
Figure 4F:
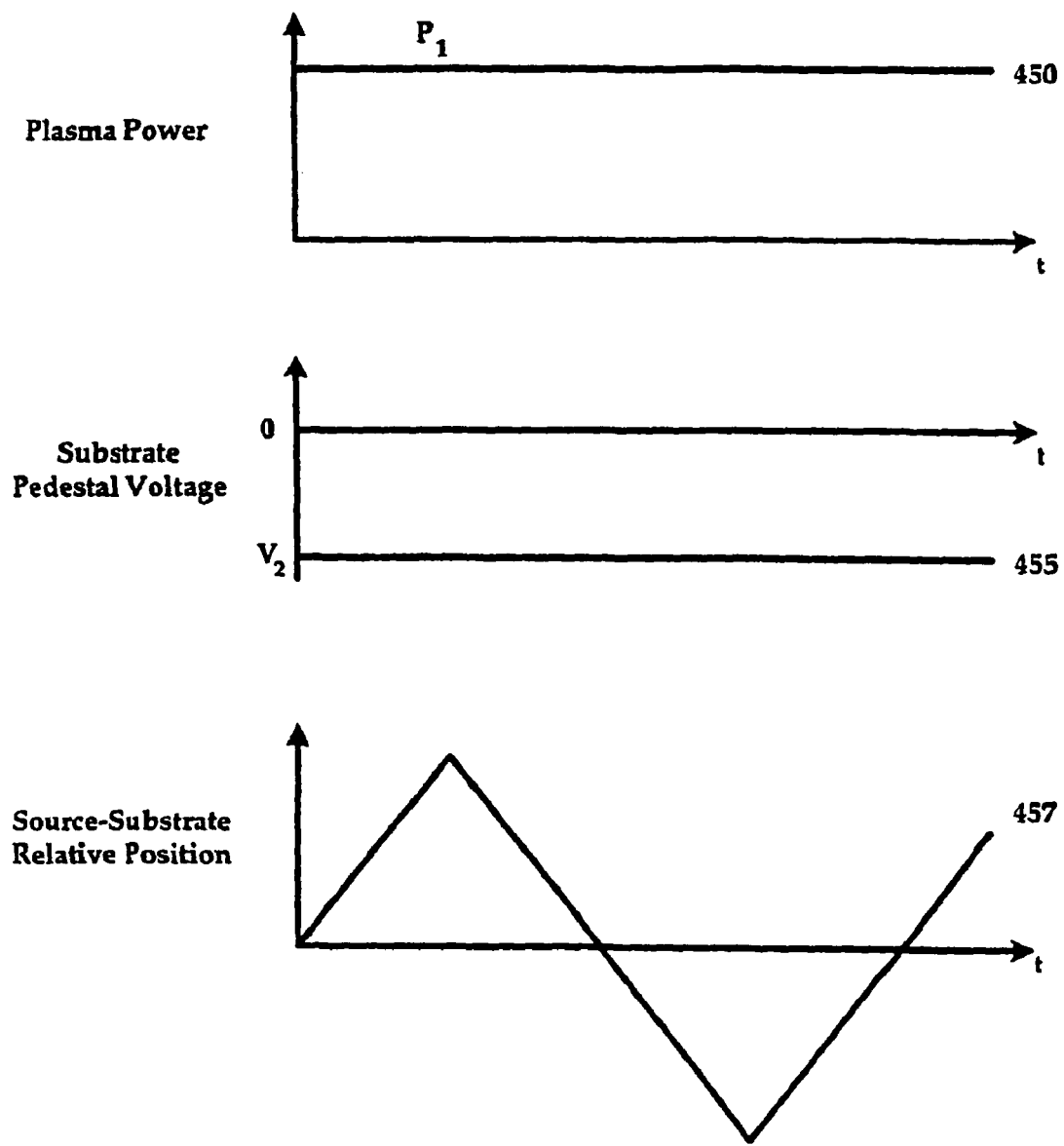

Alternatively, the substrate potential can be modulated by imparting an induced DC bias to the substrate by applying RF power to the pedestal. Preferably, the RF power is coupled into the ESC electrodes. FIGS. 4A-4F illustrate the methods of modulating the MII-ALD process. In FIG. 4A, an RF bias power $B_2$ is applied to the substrate pedestal 182 imparting an induced DC bias $V_2$ to the substrate while the plasma (either microwave or RF) power 400 is varied periodically between a high $P_1$ and a low $P_2$ power state. In FIG. 4B, plasma (either microwave or RF) power 410 is constant $P_1$ while an RF bias power, applied to the substrate pedestal 182, is varied between a low $B_1$ and a high $B_2$ bias state ($V_1$ and $V_2$ are the DC offset or bias voltages resulting from the applied RF bias power). In FIG. 4C, a negative DC bias 425 is applied to the substrate pedestal 182 while the plasma (either microwave or RF) power 420 is varied periodically between a high $P_1$ and a low power $P_2$ state. In FIG. 4D, plasma (either microwave or RF) power is constant 430 while a DC bias 435 applied to the substrate pedestal 182 is varied between a zero $V_1$ and a negative voltage state $V_2$. In FIG. 4E, a mechanical shutter periodically occludes the ion source. All the while, the plasma power 440 (either microwave or RF) and substrate voltage 445 are held constant. In FIG. 4F, a source area that is smaller than the substrate 181 is preferably used. In this case, plasma (either microwave or RF) power 450 is constant, a negative DC substrate bias 455 is constant, and the source and substrate 181 are moved relative to each other 457, exposing only a portion of the substrate 181 at a time.

This process utilizes independent control over the three constituents of plasma—ions, atoms, and precursors. Decoupling these constituents offer improved control over the deposition process.

An added benefit of using MII-ALD is that with proper choice of the second reactant, selective ion-enhanced etching and removal of unwanted impurities can be performed. As an example, for many chemistries, the preferred second reactant is monatomic hydrogen (H) 176. Simultaneous energetic ion and reactive atomic H bombardment will cause selective removal of unwanted impurities (e.g., containing carbon, oxygen, fluorine, or chlorine) commonly associated with organometallic precursors (e.g., TBTDET, PEMAT, PDEAT, TDMAT, TDEAT), and proceed with removal rates superior to either chemical reaction (e.g., atomic H only) or physical sputtering (e.g., Ar ion only) alone. Impurities lead to high film resistivities, low film density, poor adhesion, and other deleterious film effects. Alternatively, in addition to atomic hydrogen, other reactive groups such as nitrogen atoms (N), oxygen atoms (O), OH molecules, or NH molecules, or a combination thereof may be employed.

Figure 6:
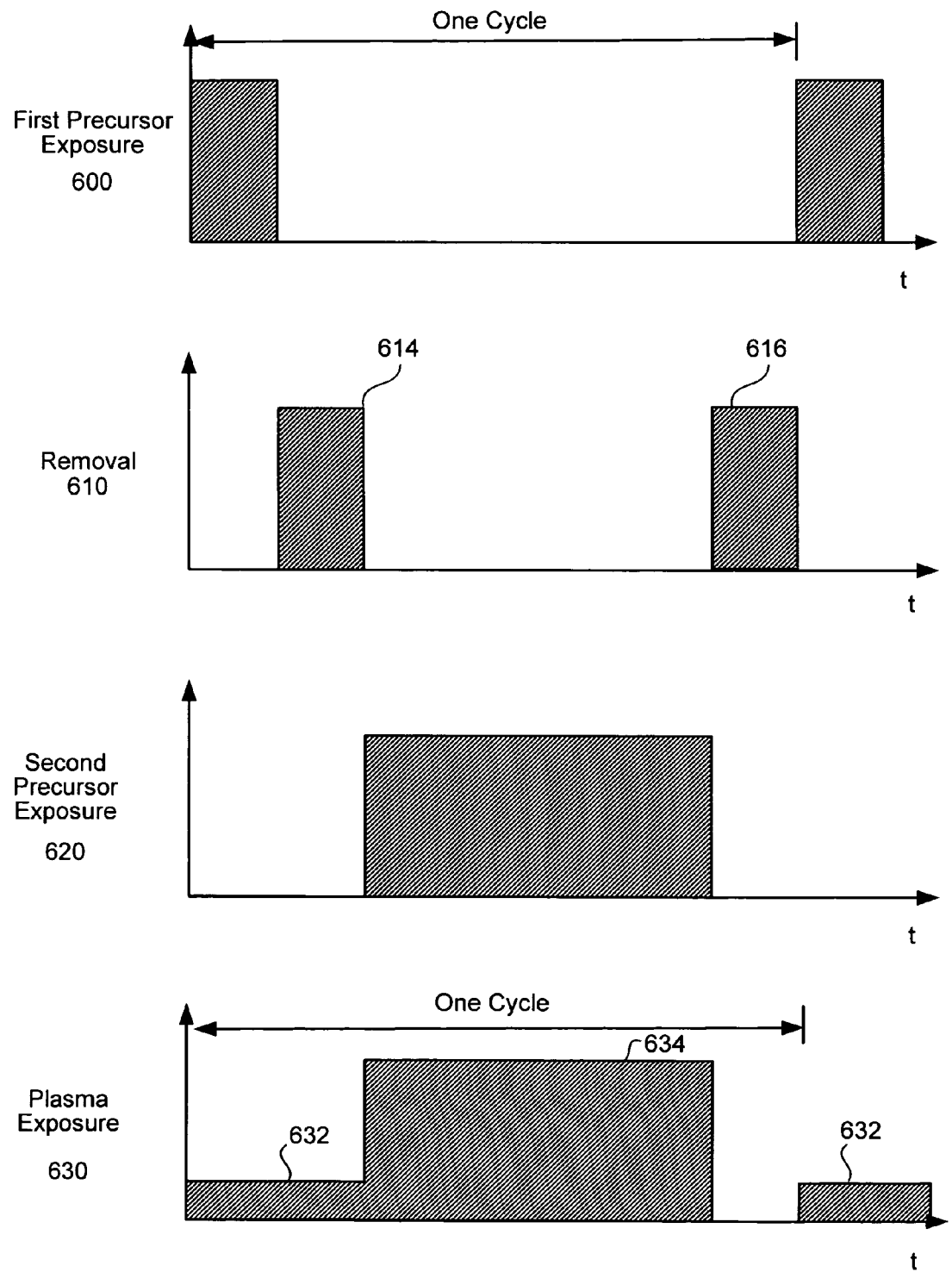
FIG. 6 shows a timing sequence for an improved sequential method of depositing a film.

Another embodiment of the above-described methods is shown in FIG. 6. Here, a first precursor is exposed to a plasma 630 during its introduction into the chamber 180. Specifically, during the first precursor exposure 600 and the precursor removal 610, the excitation source is on at some level (step 632) less than the level during the second precursor exposure 620 (step 634). However, at step 632, the excitation source power should not be so high as to cause sputtering of the first precursor or damage to the substrate.

More specifically, as shown in FIG. 6, the plasma exposure 630 begins with the introduction of the first precursor 600 and continues through the first precursor removal 614. This results in an improved sequential ALD process as follows.

1) First exposure 600: The substrate 181 is exposed to a gaseous reactant 100 (e.g., precursor A), allowing a layer of the reactant to form on the surface. The substrate 181, as discussed, may be at a temperature above or below the decomposition temperature of the first gaseous reactant. This step may, in one embodiment, last about one-half of a second.
2) First removal 610: The excess reactant 100 is removed by evacuating 614 the chamber 180 with a vacuum pump 184. Alternatively, in another configuration, the excess reactant is purged from the chamber. This step may also last about one-half of a second. During the first precursor 600 and the removal 614, the excitation source 630 is on to expose the first precursor to a plasma. The plasma may be an Ar plasma or any combination of plasma gases. The power 160 (RF), in one embodiment, may be approximately 50 W during step 632.
3) Second exposure 620: The substrate 181 is simultaneously exposed to ions 177 and a second gaseous reactant during this step with the substrate 181 biased to a negative potential $V_{bias}$ 185. As discussed, RF power 160 may be supplied into the plasma chamber 170 to generate both the ions 177 (e.g., argon-ion ($Ar^+$)) and radicals 176 (e.g., H atoms). The power 160 (RF) may be approximately 425 W. This step 634 may last approximately two seconds.
4) Second removal 610: The power 160 is off (plasma shutdown), and the excess second reactant and plasma are removed by evacuating or purging 616 the chamber 180. This step may also last about one-half of a second. Alternatively, this step may be shorter or longer than removal 614.
5) Repeat: The desired film thickness is built up by repeating the entire process cycle (steps 1-4) many times.

In another embodiment, the plasma exposure 630 may be discontinued during the removal 614. It would then be restarted during the second exposure 620 to form an ion-generating plasma. In another embodiment, the plasma exposure may be or may not be discontinued in step 616.

The sequential method shown in FIG. 2B, where ion exposure is initiated after the second reactant exposure, may also be enhanced by exposing the first precursor to a plasma, that may or may not cause a visible glow, during the first precursor exposure and removal steps.

Figure 7:
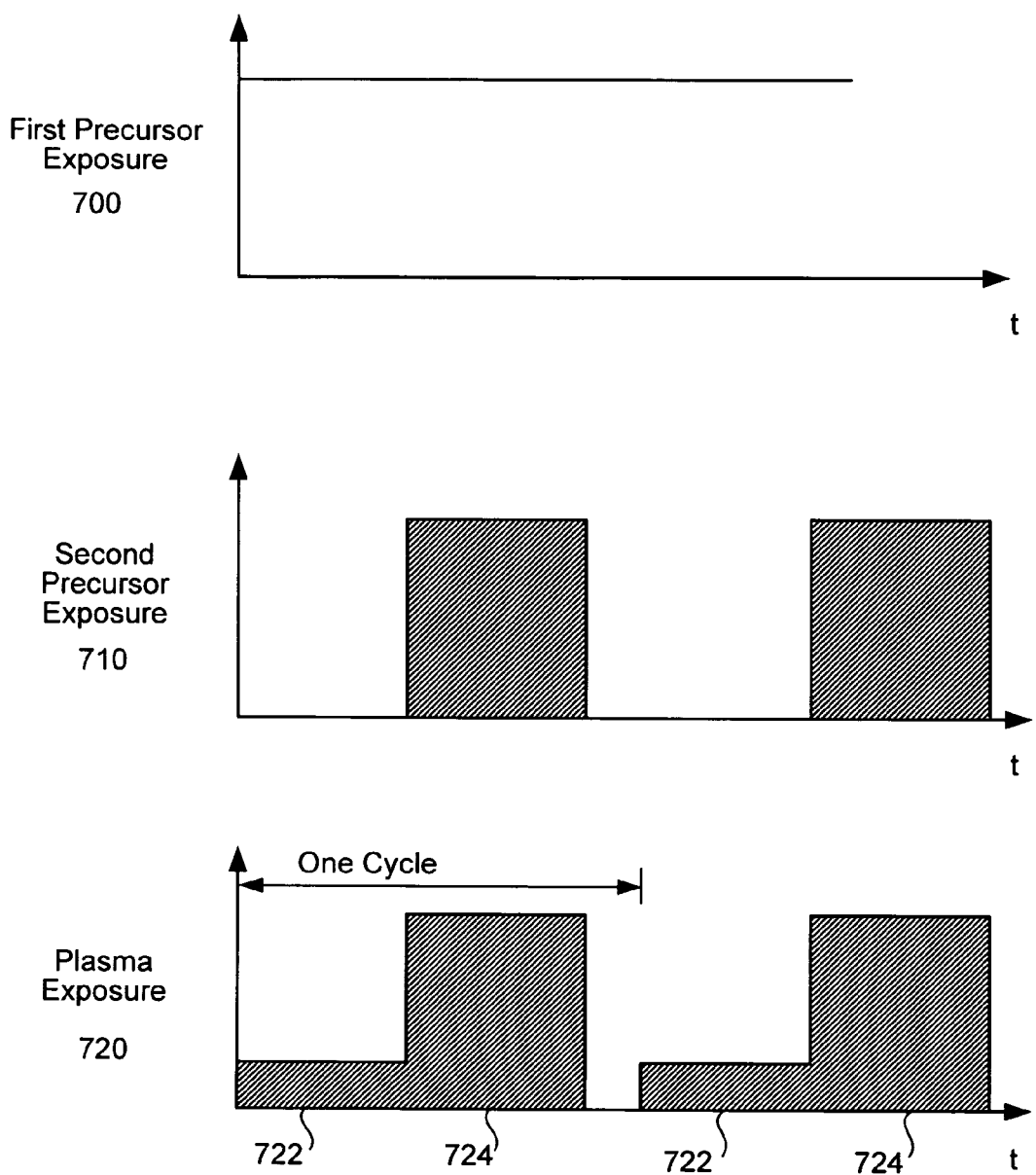
FIG. 7 shows a timing sequence for an improved continuous method of depositing a film.

Similarly, the continuous processes shown in FIGS. 3A and 3B may be enhanced by the above-described plasma exposure. For instance, as shown in FIG. 7, the first precursor 700 may be subjected to plasma exposure 720 (step 722) before full power is applied (step 724) during the second precursor 710 exposure. In one embodiment, the excitation source may form a plasma at step 722 and an ion-generating plasma at step 724.

The method of the present invention increases the chemical reactivity of a precursor by removing or otherwise altering at least one ligand of a precursor molecule. The size of the precursor molecule may be changed. For instance, the size may be reduced. The polarization of the precursor molecule may also be changed. For example, the polarization may be increased or decreased, or the sign of polarization may be changed.

As discussed above, the substrate is exposed to a sequence of discreet states. Each of the states represent a step in a deposition cycle. The sequence of steps is repeated to produce a film of a desired thickness. In at least one of the steps, the substrate is exposed to a vapor containing at least one precursor chemical. The precursor vapor adsorbs onto the substrate. The rate of adsorption is not infinite and the density of the adsorbed molecules is also not infinite. However, these two factors influence the cycle time which impacts throughput as well as the deposition rate per cycle. The rate of adsorption as well as the number of available adsorption sites is a function of the substrate and precursor pair. Therefore, altering the precursor results in an alteration of the adsorption rate and number of sites. An alteration that cleaves part of at least one ligand, for example, exposes a chemically reactive bond that in turn can be subject to its own adsorption mechanisms with the substrate independent of the rest of the precursor molecule. Moreover, if this alteration reduces the size of the precursor molecule, then the Steric hindrance phenomena is minimized. Steric hindrance is the phenomena wherein a collection of molecules preferentially space themselves out. In other words, the molecules do not like to be crowded.

The precursor gas, in one implementation, may be exposed to the plasma in the region between the gas line 132 and the showerhead 171. The precursor gas may also be exposed to the plasma in the region below the showerhead.

A precursor molecule, in any event, is altered at or near the substrate rather than in a remote fashion. The present invention thus provides a more reactive precursor molecule, but only in the region of interest in the vicinity of the substrate to prevent stray or parasitic reactions with the vapor delivery system. This sort of precracking during nucleation also reduces nucleation delay for all substrate materials.

Multiple excitation sources may also be used with the present invention. The excitation source employed at step 632 may also be a separate source from that employed at step 634. Additionally, the excitation energy applied at step 632 may vary from one cycle to another cycle to compensate for effects that may vary with time or cycle numbers. For example, as film builds up in the chamber, it alters the ability of the chamber to transmit RF energy. This alteration can be compensated for by varying the applied RF coupling.

Also, in other implementations, the precracked precursor exposure may follow some other reactive gas/plasma exposure step. Also, the plasma, in another embodiment, may be an ion-generating plasma at steps 632 and 722. Moreover, the precursor may be exposed to an excited species at steps 632 and 722. An excited species may be an excited gas which forms an ion-generating plasma, a plasma or afterglow, and/or includes ions, free electrons, or meta-stable gas atoms. Further, in another variant of these techniques, the power level at steps 632 and 722, for instance, may be the same as or greater than the power level at step 634 and 724.

Figure 8:
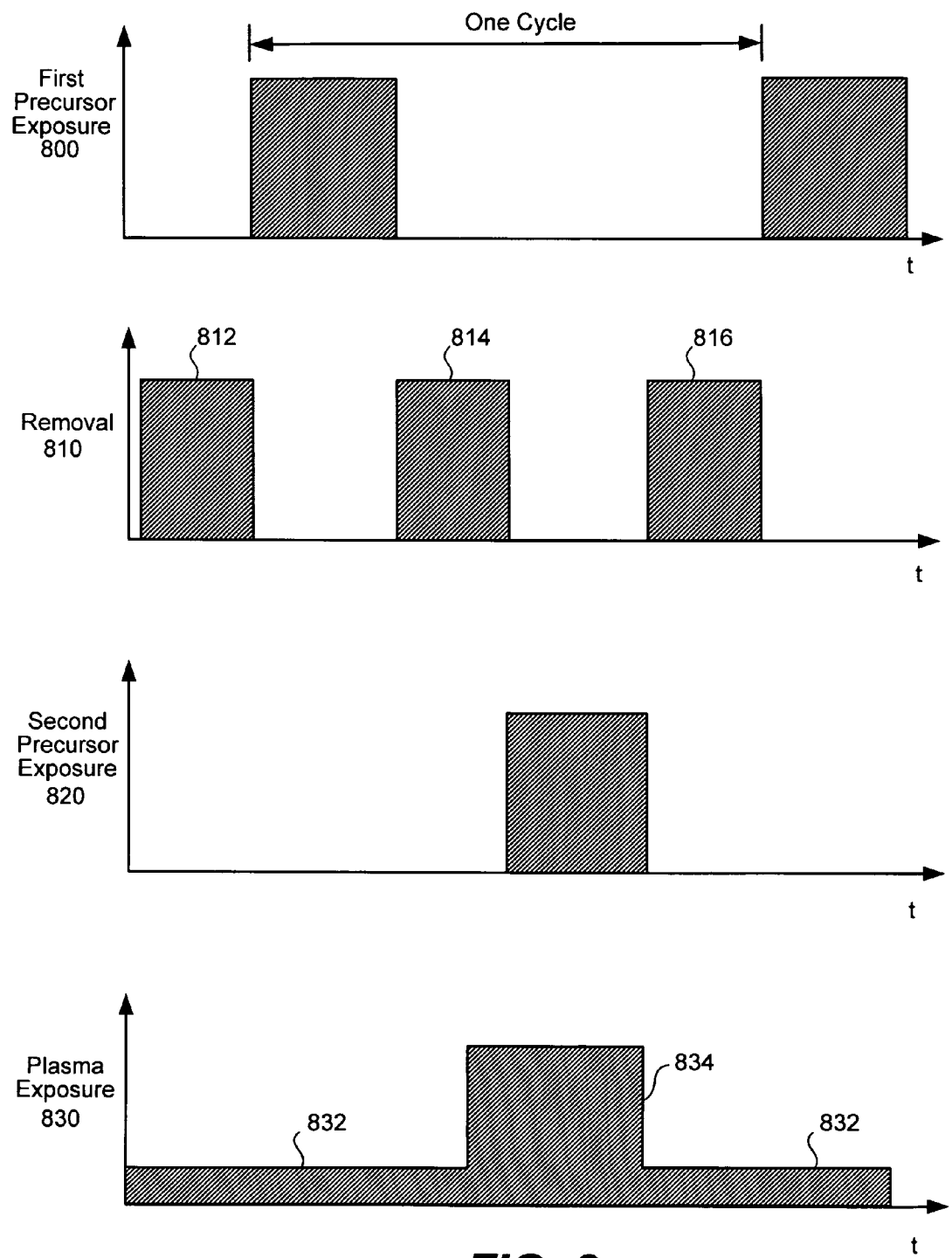
FIG. 8 shows a timing sequence for another method of depositing a film wherein an excitation energy source is operated between the film formation steps.

In another embodiment, as shown in FIG. 8, the excitation energy is maintained at some low value greater than zero during the periods between plasma exposure for reacting a first precursor film and a second precursor. In the MII-ALD sequential and continuous processes, for example, the substrate is periodically exposed to an ion-generating plasma. A substantial amount of the cycle time is dedicated to the ion-generating plasma step. The ion-generating plasma step, in these processes, can be reduced if the non-productive time associated with the plasma stabilization time is reduced or eliminated. The method of the present invention does just that.

It is generally assumed that the excitation energy must be reduced to zero between the ion-generating plasma steps to prevent gas phase decomposition of the vapors in the ambient and possible resulting contamination of the deposited film. It has been found, however, that this is not the case. The present invention increases throughput by reducing or eliminating the non-productive time in a cyclic deposition process that occurs with each deposition cycle.

As shown in FIG. 8, the excitation source 830 may be on at some low value (step 832) prior to film formation (step 834). The excitation energy source is, thus, operated in an idling condition prior to film formation. In the MII-ALD sequential process, for example, ions and radicals are generated at step 834, which takes place during the second precursor exposure 820. The idling step 832 may occur, as shown, during the first precursor exposure 800 and removal 810 (step 814). By idling the excitation energy source at step 832, the plasma is, in effect, seeded. This eliminates the incubation time or ignition delay in the plasma/ion generation step 834. In one embodiment, the power 160 (RF) may be approximately 50 W and 425 W, respectively, at steps 832 and 834.

At step 832, an afterglow rather than a plasma may be formed. The excitation source may also be operated at this same low value only during removal 814, after the first precursor exposure 800. The excitation source may also be operated at this low value during removal 816.

The plasma may be generated by microwave or RF power. The plasma may also be generated by DC power. The excitation source, in other embodiments, may be ultraviolet light, x-rays, a high DC field, a molecular beam, an ion beam, or some other form of electromagnetic radiation. The excitation source may also be some combination of these sources.

The present invention is not limited to use with an MII-ALD system and process. The present invention may be used with various cyclic deposition systems and techniques. For example, it may be used with ALD, ALCVD, pulsed nucleation layer (PNL), or pulsed deposition layer (PDL) systems and methods.

The method of the present invention can be used to deposit various materials, including dielectric, oxide, semiconducting, or metal films, used in the semiconductor, data storage, flat panel display, and allied as well as other industries. In particular, the method and apparatus is suitable for the deposition of barrier layers, adhesion layers, seed layers, low dielectric constant (low-k) films, and high dielectric constant (high-k) films. The deposited layer may be one or more monolayers, or it may be a fractional layer, which is less than one monolayer.

From the description of the preferred embodiments of the process and apparatus set forth above, it is apparent to one of ordinary skill in the art that variations and additions to the embodiments can be made without departing from the principles of the present invention. As an example, chlorine, bromine, fluorine, oxygen, nitrogen, hydrogen, other reactants and/or radicals containing the aforementioned elements or a combination thereof, in conjunction with energetic ion bombardment, can be used to effect etching or material removal as opposed to deposition. This is of particular importance in the cleaning of native oxides of copper, aluminum, silicon, and other common conductor and semiconductor materials used in IC manufacturing. Either the deposition or etching can be accomplished globally (as illustrated in the preceding embodiments) or may be chosen to be local to a controlled area (i.e., site-specific using a small, ion beam point or broad-beam source scanned or otherwise stepped across the substrate, exposing only a fraction of the substrate area at any given time).

What is claimed is:

1. A cyclic method of depositing a film onto a substrate in a chamber comprising:
   (a) introducing at least one precursor vapor into the chamber to adsorb at least one layer of the precursor vapor on the substrate;
   (b) operating an excitation energy source at a first power level to generate a plasma to form ions and radicals;
   (c) reacting the adsorbed layer of the precursor vapor with the ions and radicals generated with the excitation energy source at the first power level to form the film; and
   (d) outside of steps (b) and (c), operating the excitation energy source at a second power level, the second power level being less than the first power level such that an afterglow is maintained, and such that a plasma stabilization time for the plasma generated at the first power level is minimized.

2. The method of claim 1, wherein the excitation energy source is selected from the group consisting of microwave power, DC power, RF power, ultraviolet light, x-rays, a high DC field, a molecular beam, an ion beam, and combinations thereof.

3. The method of claim 1, wherein the cyclic method is repeated until the film achieves a desired thickness.

4. The method of claim 1, further comprising:
   before step (b), removing excess precursor vapor from the chamber.

5. The method of claim 1, wherein the excitation energy source is RF power, and wherein the first power level is approximately 425 watts and the second power level is approximately 50 watts.

6. The method of claim 1, further comprising:
   exposing the precursor vapor to the afterglow or the plasma to form a more reactive precursor vapor.

7. A cyclic sequential method for depositing a film onto a substrate in a chamber comprising:
   (a) introducing a reactant gas into the chamber to adsorb at least one layer of the reactant gas onto the substrate;
   (b) removing excess reactant gas from the chamber;
   (c) introducing at least one ion generating feed gas into the chamber;
   (d) introducing at least one radical generating feed gas into the chamber;
   (e) operating an excitation energy source at a first power level to generate a plasma from the ion generating feed gas and the radical generating feed gas to form ions and radicals;
   (f) exposing the substrate to the ions and the radicals;
   (g) modulating the ions and the radicals;
   (h) reacting the adsorbed layer of the reactant gas with the ions and the radicals generated with the excitation energy source at the first power level to deposit the film; and
   (i) prior or subsequent to step (e), operating the excitation energy source at a second power level greater than zero but less than the first power level such that an afterglow is maintained, and such that a plasma stabilization time for the plasma generated at the first power level is minimized.

8. The method of claim 7, wherein step (b) is accomplished by evacuating the chamber.

9. The method of claim 7, wherein step (b) is accomplished by purging the chamber.

10. The method of claim 7, wherein the cyclic method is repeated until the film achieves a desired thickness.

11. The method of claim 7, further comprising exposing the substrate to at least one additional reactant gas.

12. The method of claim 7, wherein the substrate is simultaneously exposed to the ions and the radicals.

13. The method of claim 7, wherein the substrate is exposed to the ions after exposure to the radicals.

14. The method of claim 7, wherein the excitation energy source is selected from the group consisting of microwave power, DC power, RF power, ultraviolet light, x-rays, a high DC field, a molecular beam, an ion beam, and combinations thereof.

15. A cyclic method for depositing a film onto a substrate in a chamber comprising:
   (a) introducing at least one reactant gas into the chamber to adsorb at least one layer of the reactant gas on the substrate;
   (b) generating a plasma, from an ion generating feed gas to form ions and a radical generating feed gas to form radicals, by operation of an excitation energy source at a first power level;
   (c) electrically biasing the substrate to a negative potential;
   (d) exposing the substrate to the ions and the radicals generated with the excitation energy source at the first power level;
   (e) modulating the ions and the radicals;
   (f) reacting the adsorbed layer of the reactant gas with the ions and radicals to deposit the film; and
   (g) prior or subsequent to step (b), operating the excitation energy source at a second power level greater than zero but less than the first power level such that an afterglow is maintained, and such that a plasma stabilization time for the plasma generated at the first power level is minimized.

16. The method of claim 15, wherein the cyclic method is repeated until the film achieves a desired thickness.

17. The method of claim 15, further including exposing the reactant gas to the afterglow to form a more reactive reactant gas.

18. The method of claim 15, wherein the excitation energy source is selected from the group consisting of microwave power, DC power, RF power, ultraviolet light, x-rays, a high DC field, a molecular beam, an ion beam, and combinations thereof.

19. A method of depositing a film onto a substrate in a deposition chamber comprising:
   (a) introducing at least one precursor vapor into the deposition chamber to adsorb at least one layer of the precursor vapor on the substrate;
   (b) operating an excitation energy source at a first power level to generate a plasma that includes ions and radicals;
   (c) reacting the adsorbed layer of the precursor gas with ions and radicals to form the film;
   (d) in a subsequent deposition cycle, repeating steps (a), (b) and (c); and
   (e) between the first deposition cycle and the subsequent deposition cycle, operating the excitation energy source at a second power level greater than zero but less than the first power level such that an afterglow is maintained, and such that a plasma stabilization time for the plasma generated at the first power level is minimized.

20. The method of claim 19, wherein the excitation energy source is selected from the group consisting of microwave power, DC power, RF power, ultraviolet light, x-rays, a high DC field, a molecular beam, an ion beam, and combinations thereof.

* * * * *